US007010051B2

(12) United States Patent
Murayama et al.

(10) Patent No.: US 7,010,051 B2
(45) Date of Patent: Mar. 7, 2006

(54) CODING APPARATUS, CODING METHOD AND RECORDING MEDIUM HAVING CODED PROGRAM RECORDED THEREIN, AND DECODING APPARATUS, DECODING METHOD AND RECORDING MEDIUM HAVING DECODED PROGRAM RECORDED THEREIN

(75) Inventors: Jun Murayama, Tokyo (JP); Masayuki Hattori, Kanagawa (JP); Toshiyuki Miyauchi, Tokyo (JP); Kouhei Yamamoto, Tokyo (JP); Takashi Yokokawa, Tokyo (JP)

(73) Assignee: Sony Corporation, Tokyo (JP)

( * ) Notice: Subject to any disclaimer, the term of this patent is extended or adjusted under 35 U.S.C. 154(b) by 929 days.

(21) Appl. No.: 09/816,272

(22) Filed: Mar. 23, 2001

(65) Prior Publication Data

US 2001/0045900 A1 Nov. 29, 2001

(30) Foreign Application Priority Data

Mar. 24, 2000 (JP) .............................. 2000-088597

(51) Int. Cl.
H04L 5/12 (2006.01)
(52) U.S. Cl. ....................... 375/262; 375/341; 714/780
(58) Field of Classification Search ................ 375/259, 375/262, 264, 265, 340–341, 346–350; 714/755, 714/756, 791, 810, 780, 786, 788, 794, 761, 714/795, 774
See application file for complete search history.

(56) References Cited

U.S. PATENT DOCUMENTS 5,392,299 A * 2/1995 Rhines et al. ............... 714/756

| | | | |
|---|---|---|---|
| 5,946,357 A * | 8/1999 | Sandin et al. ............. | 375/296 |
| 6,353,911 B1 * | 3/2002 | Brink ....................... | 714/780 |
| 6,611,513 B1 * | 8/2003 | ten Brink ................. | 370/342 |
| 6,622,277 B1 * | 9/2003 | Ramanujam et al. ...... | 714/755 |
| 6,732,315 B1 * | 5/2004 | Yagil et al. ................ | 714/755 |

FOREIGN PATENT DOCUMENTS

EP 1 075 088 2/2001

OTHER PUBLICATIONS

Divsalar D et al: "Serial Concatenated Trellis Coded Modulation With Rate-1 Inner Code" Globecom'00. 2000 IEEE Global Telecommunications Conference. San Francisco, CA, Nov. 27-Dec. 1, 2000, IEEE Global Telecommunications Conference, New York, NY : IEEE, US, vol. vol. 2 of 4, Nov. 27, 2000, pp. 777-782, XP001017192, ISBN: 0-7803-6452-X.

(Continued)

*Primary Examiner*—Khanh Tran
(74) *Attorney, Agent, or Firm*—Finnegan, Henderson, Farabow, Garrett, & Dunner, L.L.P.

(57) ABSTRACT

Error correction coding and decoding according to a serial concatenated modulation system are carried out under high code rate. A coding apparatus 1 comprises three convolutional coders 10, 30 and 50 for carrying out convolutional operation; two interleavers 20 and 40 for rearranging order of data input; and a multi-value mapping circuit 60 for carrying out mapping of a single point on the basis of a predetermined modulation system. The coding apparatus 1 carries out convolutional operation whose code rate is "2/3" as coding of extrinsic codes by a convolutional coder 10, and carries out convolutional operation whose code rate is "1" as coding of inner codes by a convolutional coder 50, and a multi-value modulation mapping circuit 60 applies mapping to a transmission symbol of a 8 PSK modulation system to output it as a single code transmission symbol.

16 Claims, 10 Drawing Sheets

OTHER PUBLICATIONS

Lucas R et al: "Improved list-decoding for Reed-Muller codes as generalized multiple concatenated (GMC) codes" Information Theory, 1998. Proceedings. 1998 IEEE International Symposium in Cambridge, MA, USA Aug. 16-21, 1998, New York, NY, USA,IEEE, US, Aug. 16, 1998, p. 337, XP010296906, ISBN: 0-7803-5000-6.

Peleg M et al: "On interleaved, differentially encoded convolutional codes" IEEE Transactions on Information Theory, IEEE Inc. New York, US, vol. 45, No. 7, Nov. 1999, pp. 2572-2582, XP002185118, ISSN: 0018-9448.

Benedetto S et al: "Serial concatenated trellis coded modulation with iterative decoding" Information Theory. 1997. Proceedings., 1997 IEEE International Symposium on ULM, Germany Jun. 29-Jul. 4, 1997, New York, NY, USA, IEEE, US, Jun. 29, 1997, p. 8, XP010240061 ISBN: 0-7803-3956-8.

Benedetto S et al: "Serial concatenation of interleaved codes: performance analysis, design and iterative decoding" Information Theory. 1997. Proceedings., 1997 IEEE International Symposium on ULM, Germany Jun. 29-Jul. 4, 1997, New York, NY, USA,IEEE, US, Jun. 29, 1997, p. 106, XP010240159 ISBN: 0-7803-3956-8.

Divsalar D et al: "Serial and Hybrid Concatenated Codes With Applications" International Symposium on Turbo Codes, XX, XX, Sep. 1997, pp. 80-87, XP001034844.

Ho M Ed—Fargues M P et al: "Performance bounds for serially-concatenated trellis-coded modulation" Signals, Systems & Computers, 1997. Conference Record of the Thirty-First Asilomar Conference on Pacific Grove, CA, USA Nov. 2-5, 1997, Los Alamitos, CA, USA,IEEE Comput. Soc, US, Nov. 2, 1997, pp. 1364-1368, XP010280612 ISBN: 0-8186-8316-3.

Keang-Po Ho et al: "Soft-decoding combined trellis-coded quantization/modulation" Communication Theory, vol. 5, Dec. 5, 1999, pp. 2451-2455, XP010373393.

Franz V et al: "Concatenated Decoding With a Reduced-Search BCJR Algorithm" IEEE Journal on Selected Areas in Communications, IEEE Inc. New York, US, vol. 16, No. 2, Feb. 1, 1998, pp. 186-195, XP000741773, ISSN: 0733-8716.

* cited by examiner

CODING APPARATUS, CODING METHOD AND RECORDING MEDIUM HAVING CODED PROGRAM RECORDED THEREIN, AND DECODING APPARATUS, DECODING METHOD AND RECORDING MEDIUM HAVING DECODED PROGRAM RECORDED THEREIN

BACKMOBILE OF THE INVENTION

1. Field of the Invention

The present invention relates to a coding apparatus for carrying out serial concatenated trellis coded modulation, a coding method and a recording medium having a coded program recorded therein, and a decoding apparatus for decoding data subjected to serial concatenated trellis coded modulation, a decoding method and a recording medium having a decoded program recorded therein.

2. Description of Related Art

Lately, the study on, for example, a communication field such as a mobile communication and a deep space communication, a broadcasting field such as terrestrial wave or satellite digital broadcasting, and a magnetic, light or photo-electro recording field has been progressed materially, but with this, the study on a code theory for the purpose of making error correction coding and decoding efficient has been carried out actively.

As a theoretical limit of code performance, a Shannon limit implied by a so-called Shannon's channel coding theorem is known.

As the coding method indicative of the performance close to the Shannon limit, there is known a coding method by serially concatenated convolutional codes described in, for example, [S. Benedetto, G. Montorsi, D. Divsalar, F. Pollara, "Serial Concatenation of Interleaved Codes: Performance Analysis, Design, and Iterative Decoding", TDA Progress 42–126, Jet Propulsion Laboratory, Pasadens, Calif., Aug. 15, 1996].

The coding by the serially concatenated convolutional codes is carried out by an apparatus having two convolutional coders and an interleaver serially concatenated. The decoding by the serially concatenated convolutional codes is carried out by an apparatus having two decoding circuits for outputting a soft-output serially concatenated, and information is transferred between the two decoding circuits to obtain the final decoded result.

Further, as an application of the coding by the serially concatenated convolutional codes, there is also known a serial concatenated trellis coded modulation, which is hereinafter referred to as SCTCM, described in, for example, [D. Divsalar, F. Pollars, "Serial and Hybrid Concatenation Codes with Applications", in Proc., Int. Symp. On Turbo Codes and Related Topics, Brest, France, pp. 80–87, September 1997]. The SCTCM system comprises a combination of the coding by the serially concatenated convolutional codes and a multi-value modulation, which collectively considers an arrangement of a signal point of a modulation signal and the decoding feature of an error correction code.

In this reference, the coding apparatus for carrying out coding according to the SCTCM system, when input data of 4-bit is input, carries out convolutional operation whose code rate is "$4/5$" as coding of a first code (hereinafter referred to an outer code) by a convolutional coder with respect to input data, applies interleave to coded data of 5-bit as the operation result, after which, carries out convolutional operation whose coded rate is "$5/6$" as coding of a second code (hereinafter referred to an inner code) by a convolutional coder with respect to input data, mapping coded data of 6-bit as the operation result to a transmission symbol of a predetermined modulation system, and outputs the produced transmission symbol the outside every coded transmission symbol. That is, this coding apparatus carries out convolutional operation whose code rate is "$4/5$" as coding of an outer code, and carries out convolutional operation whose code rate is "$5/6$" as coding of an inner code, whereby carrying out the serial concatenated convolutional operation whose code rate is "$(4/5) \times (5/6) = 4/6 = 2/3$" as a whole. On the other hand, the decoding apparatus for carrying out decoding of codes of the SCTCM system by the coding apparatus, when a reception word is received, iteratively carries out decoding operation between two soft-output decoding circuits, for example, by the predetermined number of times such as several times to scores of times, and outputs decode data on the basis of exterinsic information of soft-output obtained as a result of the predetermined number of times of the decoding operation.

As the coding apparatus for carrying out coding according to th SCTCM system and the decoding apparatus for carrying out decoding according to th SCTCM system, apparatuses shown below have been also proposed. In the following, the coding apparatus for carrying out coding according to th SCTCM system and the decoding apparatus for carrying out decoding according to th SCTCM system will be explained. In the following description, a contemplation is made of a case in which as shown in FIG. 1, digital information is subjected to serially concatenated convolutional coding by a coder 201 provided on a transmission device not shown, which output is input into a receiver not shown through a memoryless channel 202 with noises, which is decoded by a decoder 203 provided on the receiver.

As the coding apparatus 201 for carrying out coding according to th SCTCM system, there has been proposed an apparatus comprising a convolutional coder 210 for carrying out coding of a first code (hereinafter referred to as an outer code), an interleaver 220 for rearranging order of data input, a convolutional coder 230 for carrying out coding of a second code (hereinafter referred to as an inner code), and a multi-value modulation mapping circuit 240 for carrying out mapping of a signal point on the basis of a predetermined modulation system, as shown in FIG. 2. The coding apparatus 201 carries out serially concatenated convolutional operation whose code rate is "$2/3$" with respect to input data D201 of 2-bit input, which is converted to code data D204 of 3-bit and subjected to mapping to, for example, a transmission symbol of a 8 PSK (8-Phase Shift Keying) modulation system to output it as a code transmission symbol D205 of 3-bit.

The convolutional coder 210, when input data D201 of 2-bit is input, carries out convolutional operation with respect to the input data D201, and outputs the operation result to an interleaver 220 in the later stage as code data D202 of 3-bit. That is, the convolutional coder 210 carries out convolutional operation whose code rate is "$2/3$" as coding of an outer code, and outputs the code data D202 to the interleaver 220 in the later stage.

The interleaver 220 inputs the code data D202 comprising three bit series output from the convolutional coder 210, rearranges order of bits constituting the code data D202, and outputs the produced interleave data D203 to a convolutional coder 230 in the later stage.

The convolutional coder 230, when the interleave data D203 of 3-bit is input, carries out convolutional operation with respect to the interleave data D203, and outputs the operation result to a multi-value modulation mapping circuit 240 in the later stage as code data D204 of 3-bit. That is, the convolutional coder 230 carries out convolutional operation whose code rate is "3/3=1" as coding of an inner code and outputs the code data D204 to the multi-value modulation mapping circuit 240 in the later stage.

The multi-value modulation mapping circuit 240 causes the code data D204 output from the convolutional coder 230 to synchronize with a clock to map it to a transmission symbol of a 8PSK modulation system, for example. Since a signal point of one transmission symbol in the 8SPSK modulation system is data of 3-bit, the multi-value modulation mapping circuit 240 maps the code data D204 of 3-bit output from the convolutional coder 230 as one transmission symbol to produce one code transmission symbol D205. The multi-value modulation mapping circuit 240 outputs the produced code transmission symbol D205 outside.

As described above, the coding apparatus 201 carries out convolutional operation whose code rate is "2/3" as coding of an outer code by the convolutional coder 210, and convolutional operation whose code rate is "1" as coding of an inner code is carried out by the convolutional coder 230 to thereby carry out the serially concatenated convolution operation whose code rate is "(2/3)×1=2/3" as a whole. Data code and modulated by the coding apparatus 201 is output to the receiver through the memoryless channel 202.

On the other hand, as the decoding apparatus 203 for carrying out decoding of codes of the SCTCM system by the coding apparatus 201, there has been proposed an apparatus comprising a soft-output decoding circuit 250 for carrying out decoding of an inner code, a deinterleaver 260 for returning order of data input to the original, an interleaver 270 for rearranging order of data input, and a soft-output decoding circuit 280 for carrying out decoding of an outer code, as shown in FIG. 3, for example. The decoding apparatus 203 takes an analog value due to the influence of noises generated on the memoryless channel 202, and presumes the input data D201 in the coding apparatus 201 from the reception word D206 to be a soft-input to output it as decode data D211.

The soft-output decoding circuit 250 is provided corresponding to the convolutional coder 230 in the coding apparatus 201 to carry out MAP (Maximum A Posteriori probability) decoding based on the so-called BCJR (Bahl, Cocke, Jelinek and Raviv) algorithm. The soft-output decoding circuit 250 inputs the soft-input reception word D206 received by the receiver, inputs priori probability information D207 with respect to soft-input information bits supplied from the interleaver 270, and carries out soft-output decoding of an inner code using these reception word 206 and priori probability information D207. The soft-output decoding circuit 250 produces exterinsic information D208 with respect to the information bits obtained under the constraint conditions of codes, and outputs the exterinsic information D208 to the deinterleaver 260 in the later stage as a soft-output. The exterinsic information D208 corresponds to the interleave data D203 interleaved by the interleaver 220 in the coding apparatus 201.

The deinterleaver 260 applies the deinterleave to the soft-input exterinsic information D208 output from the soft-output decoding circuit 250 so that a bit array of the interleave data D203 interleaved by the interleaver 220 in the coding apparatus 201 is returned to a bit array of the original code data D202. The interleaver 260 outputs data obtained by interleaving as the priori probability information D209 with respect to signal bits in the soft-output decoding circuit 280 in the later stage.

The interleaver 270 applies the interleave based on the same exchange position information as the interleaver 220 in the coding apparatus 201 with respect to the exterinsic information D210 relative to the soft-input code bit output from the soft-output decoding circuit 280. The interleaver 270 outputs data obtained by interleaving as the priori probability information D207 with respect to information bits in the soft-output decoding circuit 250.

The soft-output decoding circuit 280 is provided corresponding to the convolutional coder 210 in the coding apparatus 201 to carry out the MAP decoding and SOVA decoding based on the BCJR algorithm described above, similarly to the soft-output decoding circuit 250. The soft-output decoding circuit 280 inputs priori probability information D209 with respect to the soft-input code bit output from the deinterleaver 260, inputs priori probability information whose value is "0", though not shown, and carries out soft-output decoding of an outer code using the priori probability information. The soft-output decoding circuit 280 produces exterinsic information D210 with respect to the code bit obtained under the constraint condition of codes, and outputs the exterinsic information D210 as a soft-output to the interleaver 270. Further, the soft-output decoding circuit 280 produces exterinsic information with respect to information bit obtained under the constraint condition of codes, and outputs decode data D211 of hard-output on the basis of the exterinsic information.

The decoding apparatus 203 as described above, when the reception word is received, iteratively carries out decoding operation of the soft-output decoding circuit 250 to the soft-output decoding circuit 280 by the number of predetermined times, for example, such as several times to scores of times to output the decode data D211 on the basis of the soft-output exterinsic information obtained as a result of the number of predetermined times of decoding operation.

As described above, in the system constituted by the coding apparatus 201 and the coding apparatus 203, the coding according to the SCTCM system and the decoding according to the SCTCM system can be carried out.

Incidentally, the conventional actual conditions were that in the system comprising the aforementioned coding apparatus 201 and the decoding apparatus 203, the error correction coding and decoding according to the SCTCM system can be carried out under the high coding rate, but there remains room of improvement in terms of the performance.

SUMMARY OF THE INVENTION

The present invention has been accomplished in view of the actual conditions as noted above. It is an object of the present invention to provide a coding apparatus capable of carrying out coding and decoding under the high performance, a coding method and a recording medium having a code program recorded therein, and a decoding apparatus, a decoding method and a recording medium having a decode program recorded therein.

A coding apparatus according to the present invention for achieving the aforementioned object is a coding apparatus for carrying out serially concatenated code modulation with respect to data input comprising: a first coding means for carrying out coding whose code rate is k/(k+1) with respect to data of k-bit input; a first interleaving means for interleaving order of bits constituting data comprising a bit series of (k+1) bits coded by the first coding means; at least one or more second coding means serially concatenated with the later stage away from the first interleaving means to carry out coding whose code rate is 1 with respect to data of (k+1)

bit input; at least one or more second interleaving means serially concatenated with the respective ones of the at least one or more second coding means to interleave order of bits constituting data comprising a bit series of (k+1) bits coded by the second coding means in the first stage; a third coding means serially concatenated with the second interleaving means in the final stage to carry out coding whose code rate is 1 with respect to data of (k+1) bit input; and a mapping means for mapping data of (k+1) bit coded by the third coding means to a transmission symbol of a predetermined modulation.

Further, a coding method according to the present invention for achieving the aforementioned object is a coding method for carrying out serially concatenated code modulation with respect to data input comprising: a first coding step for carrying out coding whose code rate is k/(k+1) with respect to data of k-bit input; a first interleaving step for interleaving order of bits constituting data comprising a bit series of (k+1) bits coded by the first coding step; a coding processing step for carrying out at least one or more processes including a second coding step for carrying out coding whose code rate is 1 with respect to data of (k+1) bit input; and a second interleaving step for interleaving order of bits constituting data comprising a bit series of (k+1) bits coded by the second coding step; a third coding step for carrying out coding whose code rate is 1 with respect to data of (k+1) bit processed by the coding processing step; a mapping step for mapping data of (k+1) bit code by the third coding step to a transmission symbol of a predetermined modulation.

Furthermore, a decoding apparatus according to the present invention for achieving the aforementioned object is a decoding apparatus for carrying out decoding of codes subjected to serially concatenated code modulation by coding equipment comprising: a first coding means for carrying out coding whose code rate is k/(k+1) with respect to data of k-bit input; a first interleaving means for interleaving order of bits constituting data comprising a bit series of (k+1) bits coded by the first coding means; at least one or more second coding means serially concatenated with the later stage away from said first interleaving means to carry out coding whose code rate is 1 with respect to data of (k+1) bit input; at least one or more second interleaving means serially concatenated with the respective ones of said at least one or more second coding means to interleave order of bits constituting data comprising a bit series of (k+1) bits coded by the second coding means in the first stage; a third coding means serially concatenated with the second interleaving means in the final stage to carry out coding whose code rate is 1 with respect to data of (k+1) bit input; and a mapping means for mapping data of (k+1) bit coded by the third coding means to a transmission symbol of a predetermined modulation, the decoding apparatus comprising: a first soft-output decoding means provided corresponding to the third coding means to carry out soft-output decoding using a reception word which is a soft-input input, and priori probability information with respect to information bits of (k+1) bits which is a soft-input input; at least one or more first deinterleaving means serially concatenated with the later stage away from the first soft-output decoding means to rearrange data of (k+1) bits of a soft-input input so that a bit array of data of (k+1) bits rearranged by the second interleaving means is returned to a bit array of data of (k+1) bits coded by the second coding means; at least one or more second soft-output decoding means provided corresponding to the respective ones of the at least one or more second coding means and serially concatenated with the respective ones of the at least one or more first deinterleaving means to carry out soft-output decoding using priori probability information with respect to code bits of (k+1) bits which are a soft-input output from the first deinterleaving means, and priori probability information with respect to information bits of (k+1) bits which are a soft-input input; one or more third interleaving means for interleaving order of bits constituting data comprising a bit series of (k+1) pieces of a soft-input output from the respective ones of the at least one or more second soft-output decoding means on the basis of the same exchange position information as that of the second interleaving means; a second deinterleaving means serially concatenated with the second soft-output decoding means in the final stage to rearrange data of (k+1) bits of a soft-input input so that a bit array of data of (k+1) bits rearranged by the first interleaving means is returned to a bit array of data of (k+1) bits coded by the first coding means; a third soft-output decoding means provided corresponding to the first coding means and serially concatenated with the second deinterleaving means to carry out soft-output decoding using priori probability information with respect to code bits of (k+1) bits which are a soft-input output from the second deinterleaving means, and priori probability information with respect to information bits of (k+1) bits which are a soft-input input; and a fourth interleaving means for interleaving order of bits constituting data comprising a bit series of (k+1) pieces of a soft-input output from the third soft-output decoding means on the basis of the same exchange position information as that of the first interleaving means.

Further, the decoding method according to the present invention for achieving the aforementioned object is a decoding method for carrying out decoding of codes subjected to serially concatenated code modulation by a coding method comprising: a first coding step for carrying out coding whose code rate is k/(k+1) with respect to data of k-bit input; a first interleaving step for interleaving order of bits constituting data comprising a bit series of (k+1) pieces coded by the first coding step; a coding processing step for carrying out at least one or more processes including a second coding step for carrying out coding whose code rate is 1 with respect to data of (k+1) bit input; and a second interleaving step for interleaving order of bits constituting a bit series of (k+1) pieces coded by the second coding step; a third coding step for carrying out coding whose code rate is 1 with respect to data of (k+1) bit processed by the coding processing step and input; and a mapping step for mapping data of (k+1) bits coded by the third coding step to a transmission symbol of a predetermined modulation; the decoding method comprising: a first soft-output decoding step provided corresponding to the third coding step to carry out soft-output decoding using a reception word which is a soft-input input, and priori probability information with respect to information bits of (k+1) bits which is a soft-input input; a decoding processing step for carrying out at least one or more processes including a first deinterleaving step, a second soft-output decoding step and a third interleaving step with respect to data of (k+1) bits of a soft-input input; a second deinterleaving step for rearranging data of (k+1) bits of a soft-input processed by the decoding processing step input so that a bit array of data of (k+1) bits rearranged by the first interleaving step is returned to a bit array of data of (k+1) bits coded by the first coding step; a third soft-output decoding step provided corresponding to the first coding step to carry out soft-output decoding using priori probability information with respect to code bits of (k+1) bits which are a soft-input rearranged by said second deinterleaving step, and priori probability information with respect to information bits of (k+1) bits which are a soft-input input; and a fourth interleaving step for interleaving order of bits constituting data comprising a bit series of (k+1) pieces of a soft-input output produced by said third soft-output decoding step on the basis of the same exchange position information as that of the first interleaving step; the first deinterleaving step rearranging data of (k+1) bits of a soft-input input so that a bit array of data of (k+1) bits rearranged by the second interleaving step is returned to a bit array of data of (k+1) bits coded by the second coding step; the second soft-output decoding step being provided corresponding to the respective ones of at least one or more second coding steps to carry out soft-output decoding using priori probability information with respect to code bits of (k+1) bits which are a soft-input output rearranged by the first deinterleaving step, and priori probability information with respect to information bits of (k+1) bits which are a soft-input input; and the third interleaving step for interleaving order of bits constituting data comprising a bit series of (k+1) pieces of a soft-input produced by the respective ones of at least one or more second soft-output decoding steps on the basis of the same exchange position information as that of the second interleaving step.

DESCRIPTION OF THE PREFERRED EMBODIMENTS

Preferred embodiments to which is applied the present invention will be described in detail with reference to the accompanying drawings.

Figure 1:
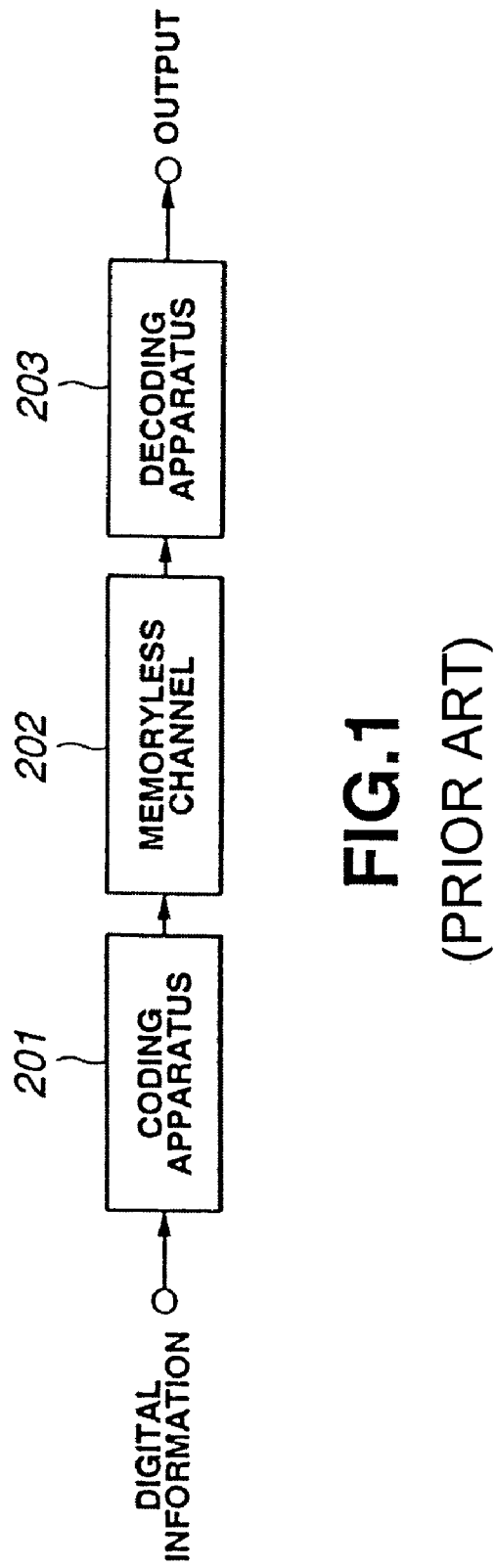
FIG. 1 is a block diagram for explaining the constitution of a communication model.
Figure 2:
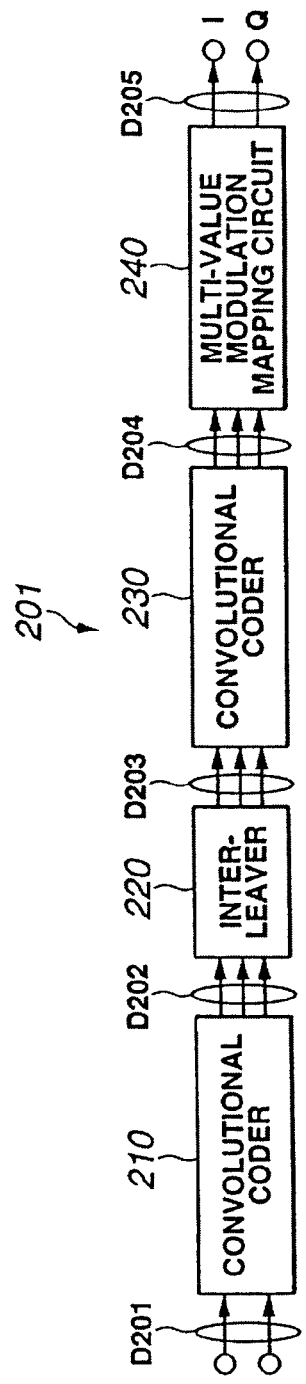
FIG. 2 is a block diagram for explaining the constitution of a conventional coding apparatus.
Figure 3:
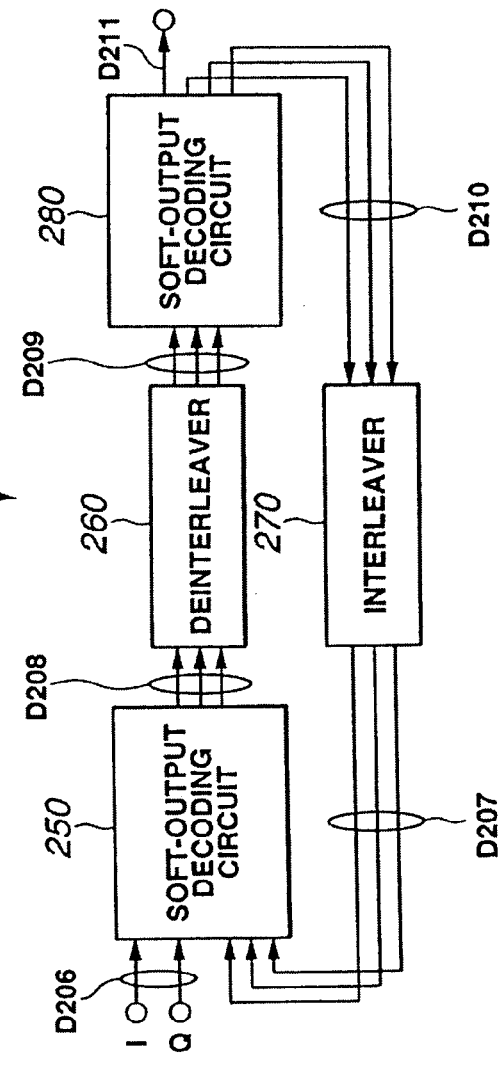
FIG. 3 is a block diagram for explaining the constitution of a conventional decoding apparatus.
Figure 4:
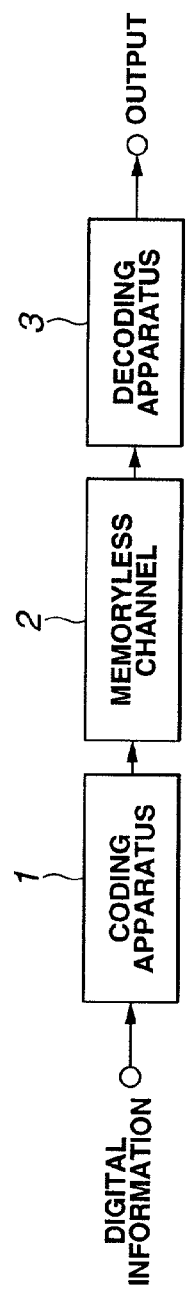
FIG. 4 is a block diagram for explaining the constitution of a communication model to which is applied a data transmit-receive system showing as the form of an embodiment according to the present invention.

This embodiment is concerned with a data transmit-receive system applied to a communication model in which as shown in FIG. 4, digital information is coded by a coding apparatus 1 provided on a communication apparatus not shown, output of which is input into a receiving apparatus not shown through a memoryless channel 2 with noises, and the output is decoded by a decoding apparatus 3 provided on the receiving apparatus.

In the data transmit-receive system, the coding apparatus 1 carries out coding according to a serial concatenated trellis code modulation, which is hereinafter referred to as SCTCM, system, in which at least three or more coders are serially concatenated through interleavers. Further, the decoding apparatus 3 carries out decoding of codes code according to the SCTCM system by the coding apparatus 1, in which at least three or more decoding circuits depending on the constitution of the coding apparatus 1 are serially concatenated.

Figure 5:
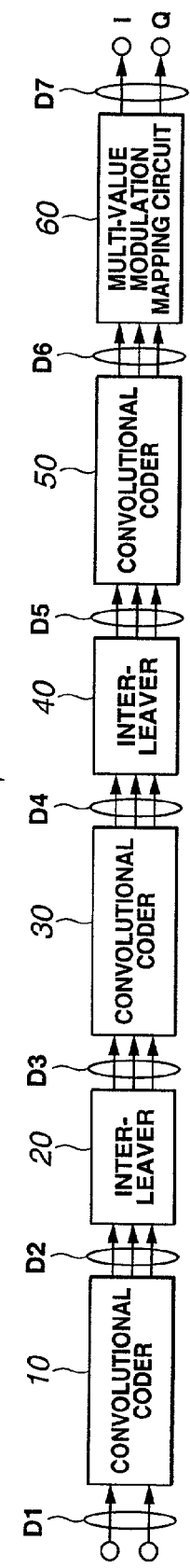
FIG. 5 is a block diagram for explaining the constitution of a coding apparatus in the data transmit-receive system.

As shown in FIG. 5, the coding apparatus 1 comprises three convolutional coders 10, 30 and 50 for carrying out convolutional operation which are a first coding means, a second coding means, a third coding means; two interleavers 20 and 40 which are a first interleaving means and a second interleaving means for rearranging order of data input; and a multi-value modulation mapping circuit 60 which is a mapping means for carrying out mapping of a signal point on the basis of a predetermined modulation system. The coding apparatus carries out serial concatenated convolutional operation whose code rate is "⅔" with respect to input data D1 of 2 bits input to convert the former into code data D6 of 3 bits, which is subjected, for example, to mapping to a transmission symbol of a 8 PSK (8-phase Shift Keying) modulation system to output it as one code transmission symbol D7 of 3 bits.

Figure 6:
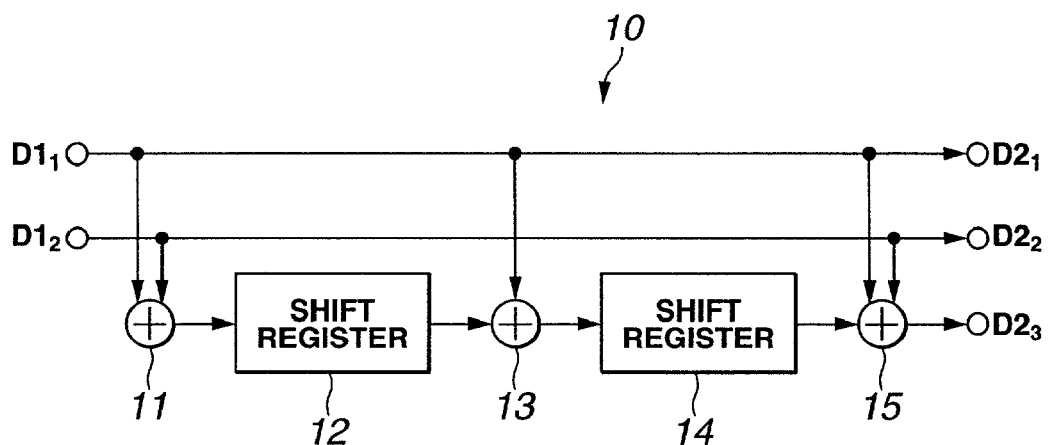
FIG. 6 is a block diagram for explaining the constitution of a convolutional coder for carrying out coding of exterinsic codes provided on a coding apparatus.

The convolutional coder 10 comprises three exclusive-OR circuits 11, 13, and 15, and two shift registers 12 and 14, as shown in FIG. 6.

The exclusive logic sum circuits 11 carries out exclusive-OR operation using input data $D1_1$ and $D1_2$ of 2 bits to supply the operation result to the shift register 12.

The shift register 12 continues to supply data of 1 bit being held to the exclusive-OR circuit 13. The shift register 12 newly holds data of 1 bit supplied from the exclusive-OR circuit 11 by being synchronized with a clock, and newly supplies the data to the exclusive-OR circuit 13.

The exclusive-OR circuit 13 uses data supplied from the shift register 12 and input data $D1_1$ of 1 bit out of input data D1 of 2 bits to carry out exclusive-OR operation to supply the operation result to the shift register 14.

The shift register 14 continues to supply data of 1 bit being held to the exclusive-OR circuit 15. The shift register 14 newly holds data of 1 bit supplied from the exclusive-OR circuit 13 by being synchronized with a clock, and newly supplies the data to the exclusive-OR circuit 15.

The exclusive-OR circuit 15 uses data supplied from the shift register 14 and input data $D1_1$ and $D1_2$ to carry out exclusive-OR operation to output the operation result to the interleaver 20 in the later stage as code data $D2_3$ of 1 bit out of code d at D2 of 3 bits.

The convolutional coder 10, when input data $D1_1$ and $D1_2$ of 2 bits are input, carries out convolutional operation with respect to the $D1_1$ and $D1_2$ to output the operation result to the interleaver 20 in the later stage as code data $D1_1$, $D1_2$ and $D2_3$ of 3 bits. That is, the convolutional coder 10 carries out convolutional operation whose code rate is "⅔" as coding of a first code (hereinafter referred to as an exterinsic code) to output code data D2 to the interleaver 20 in the later stage.

Figure 7:
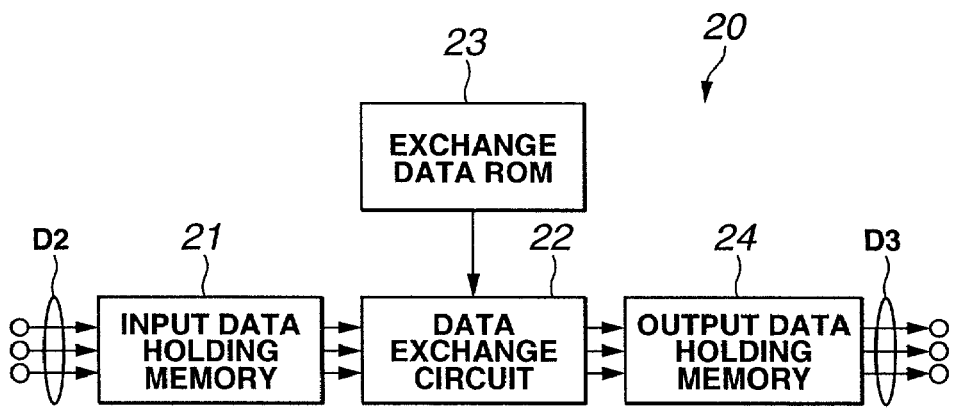
FIG. 7 is a block diagram for explaining the constitution of an interleaver provided on a coding apparatus.

As shown in FIG. 7, the interleaver 20 comprises an input data holding memory 21 for holding data input, a data exchange circuit 22 for carrying out rearrangement (exchange) of data input, an exchange data ROM (Read Only Memory) for storing exchange position information of data, and an output data holding memory 24 for holding data output.

The input data holding memory 21 holds code data D2 comprising three bit series output from the convolutional coder 10 to supply the code data D2 to the data exchange circuit 22 at a predetermined timing.

The data exchange circuit 22 rearranges order of the code data D2 supplied from the input data holding memory 21 on the basis of the exchange position information of data being stored in the exchange data ROM 23. The data exchange circuit 22 supplies the rearranged data to the output data holding memory 24.

The exchange ROM 23 stores exchange position information of data decided, for example, on the basis of random number generated. The interleaver 20 is constituted as a random interleaver for carrying out interleave of data on the basis of the exchange position information. The exchange position information stored in the exchange data ROM is read by the data exchange circuit 22 as occasion calls.

The output data holding memory 24 holds data supplied from the data exchange circuit 22, and outputs these data to the convolutional coder 30 at a predetermined timing as interleave data D3 comprising three bit series.

The interleaver 20 applies interleave to the code data D2 output from the convolutional coder 10 to output it to the convolutional coder 30 in the later stage.

More specifically, the input data holding memory 21 sequentially inputs and holds the respective ones of code data D2 comprising three bit series output from the convolutional coder 1. The input data holding memory 21 sequentially holds, for example, bits constituting respective ones of code data D2 at a predetermined timing, and supplies the data being held to the data exchange circuit 22 at a timing produced by three bit series comprising N bits (N is suitable natural number).

Continuously, the data exchange circuit 22 rearranges order of bits of N×3 pieces constituting three bit series supplied from the input holding memory 21 on the basis of exchange information stored in the exchange data ROM 23. The data exchange circuit 22 supplies three new bit series obtained by the rearrangement to the output data holding memory 24.

The output data holding memory 24 holds bits constituting three bit series supplied from the data exchange circuit 22, and outputs the data held to the convolutional coder 30 in the later stage at a predetermined timing, as the interleave data D3.

As described above, the interleaver 20 inputs the code data D2 comprising three bit series output from the convolutional coder 10, and rearrange order of bits constituting the code data D2 on the basis of exchange position information pre-stored to produce the interleave data D3.

Figure 8:
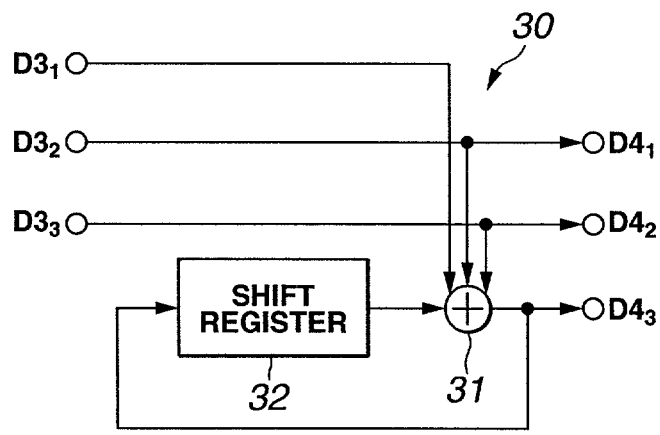
FIG. 8 is a block diagram for explaining the constitution of a convolutional coder for carrying out coding of middle codes provided on a coding apparatus.

As shown in FIG. 8, the convolutional coder 30 comprises an exclusive-OR circuit 31 and a shift register 32.

The exclusive-OR circuit 31 carries out exclusive-OR operation using interleave data $D3_1$, $D3_2$ and $D3_3$ of 3 bits to output the operation result to an interleaver 40 in the later stage as code data $D4_3$ of 1 bit out of code data D4 of 3 bits and supply them to the shift register 32.

The shift register 3 continues to supply data of 1 bit being held to the exclusive-OR circuit 31. The shift register 32 newly holds data of 1 bit supplied from the exclusive-OR circuit 31 by being synchronized with a clock, and newly supplies the data to the exclusive-OR circuit 31.

As described above, the convolutional coder 30, when the interleave data $D3_1$, $D3_2$ and $D3_3$ of 3 bits are input, carries out recursive system convolutional operation with respect to these interleave data $D3_1$, $D3_2$ and $D3_3$ to output the operation result to the interleaver 40 in the later stage as code data $D3_1$, $D3_2$ and $D3_3$ of 3 bits. That is, the convolutional coder 30 carries out recursive system convolutional operation whose code rate is "3/3=1" as coding of a second code (hereinafter referred to as a middle code) to output code data D4 to the interleaver 40.

Figure 9:
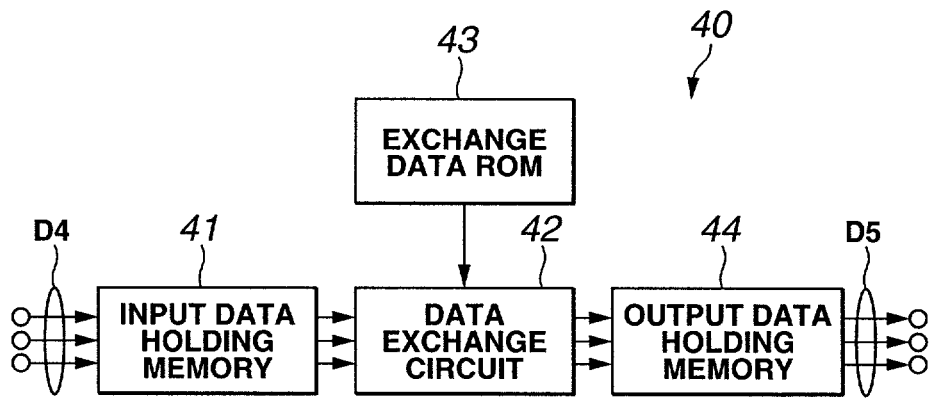
FIG. 9 is a block diagram for explaining the constitution of an interleaver provided on a coding apparatus, which is an interleaver different from that shown in FIG. 4.

The interleaver 40 comprises the constitution similar to that of the interleaver 20. That is, as shown in FIG. 9, the interleaver 40 comprises an input data holding memory 41 for holding data input, a data exchange circuit for rearranging order of data input, an exchange data ROM 43 for storing exchange position information of data, and an output data holding memory 44 for holding data output.

The interleaver 40 as described above inputs code data D4 comprising three bit series output from the convolutional coder 30, and rearranges order of bits constituting the code data D4 on the basis of exchange position information pre-stored to produce interleave data D5. The interleaver 40 outputs the produced interleave data D5 to a convolutional coder 50 in the later stage.

It is noted that exchange position information of data stored in an exchange data ROM 43 in the interleaver 40 may be the same as or different from exchange position information of data stored in the exchange data ROM 23 in the interleaver 20.

Figure 10:
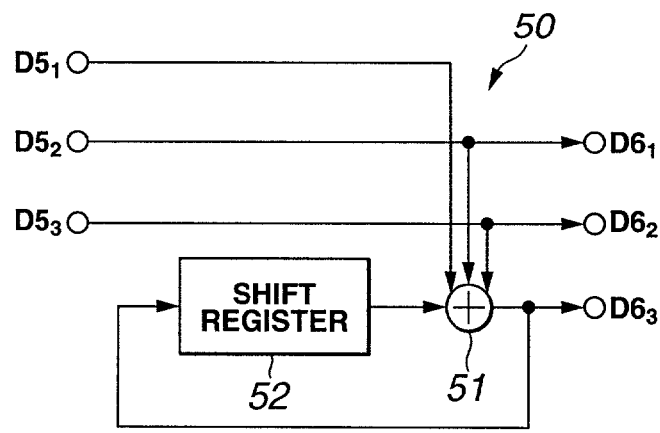
FIG. 10 is a block diagram for explaining the constitution of a convolutional coder for carrying out coding of internal codes provided on a coding apparatus.

A convolutional coder 50 comprises the constitution similar to that of the convolutional coder 30. That is, the convolutional coder 50 comprises an exclusive-OR circuit 51 and a shift register 52, as shown in FIG. 10.

The convolutional coder 50 as described above, when the interleave data $D5_1$, $D5_2$ and $D5_3$ of 3 bits are input, carries out recursive system convolutional operation with respect to these interleave data $D5_1$, $D5_2$ and $D5_3$ to output the operation result to a multi-value modulation mapping circuit 60 in the later stage as code data $D6_1$, $D6_2$ and $D6_3$ of 3 bits. That is, the convolutional coder 50 carries out recursive systematic convolutional operation whose code rate is "3/3=1" as coding of a third code (hereinafter referred to as an internal code) to output code data D6 to the multi-value modulation mapping circuit 60 in the later stage.

The multi-value modulation mapping circuit 60 causes the code data to synchronize with a clock to map to a transmission symbol of an 8PSK modulation system, for example. That is, the multi-value modulation mapping circuit 60 maps the code data D6 of 3 bits output from the convolutional coder 50 to produce one code transmission symbol D7. The multi-value modulation mapping circuit 60 outputs the produced code transmission symbol D7 outside.

The coding apparatus 1 as described above carries out convolutional operation whose code rate is "⅔" as coding of an outer code by the convolutional coder 10, carries out convolutional operation whose code rate is "1" as coding of a middle code by the convolutional coder 30, and carries out convolutional operation whose code rate is "1" as coding of an inner code by the convolutional coder 50 whereby the serial concatenated convolutional operation whose code rate is "(⅔)×1×1=⅔" can be carried out as a whole. Data coded and modulated by the coding apparatus are output to the receiving apparatus through the memoryless channel 2.

Figure 11:
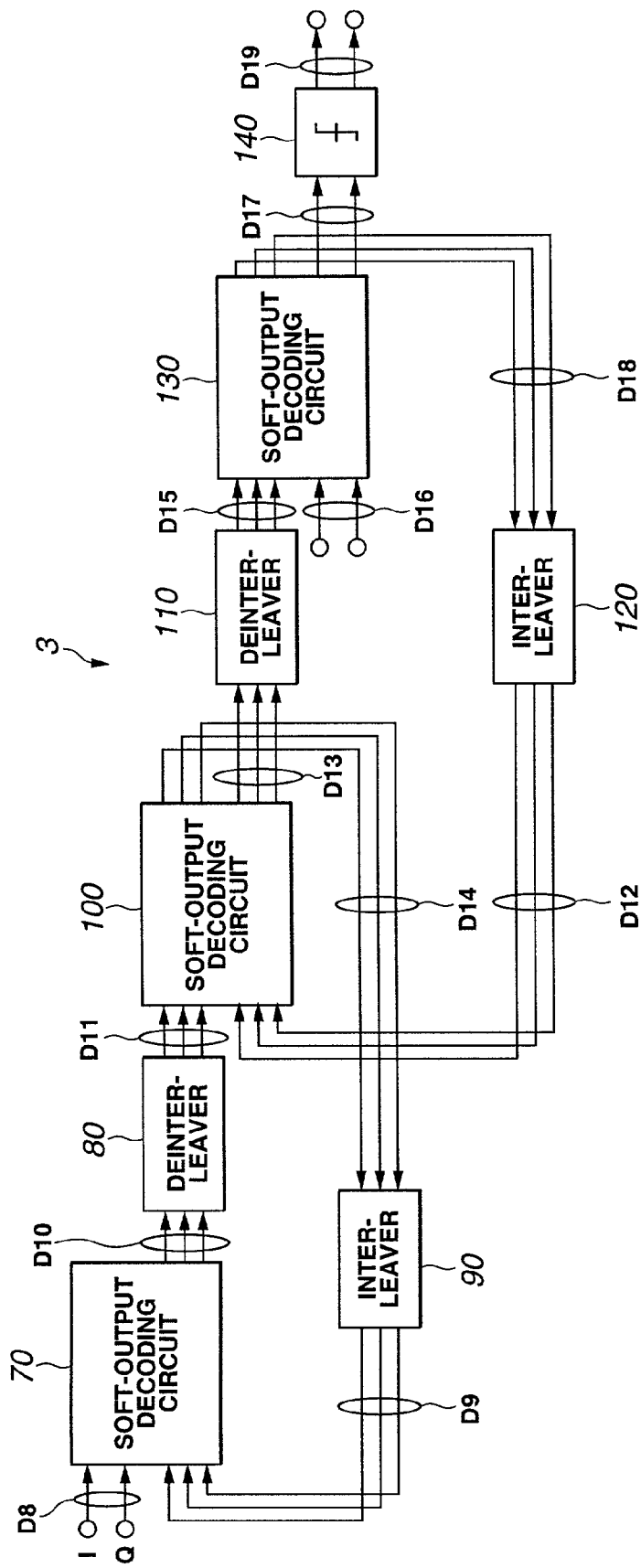
FIG. 11 is a block diagram for explaining the constitution of a decoding apparatus in the data transmit-receive system.

On the other hand, the decoding apparatus 3 comprises, as shown in FIG. 11, three soft-output decoding circuits 70, 100 and 130 which are a first soft-output decoding means, a second soft-output decoding means, and a third soft-output decoding means for carrying out soft-output decoding, two deinterleavers 80 and 110 which are a first deinterleaving means and a second deinterleaving means for returning order of data input to the original, two interleavers 90 and 120 which are a third interleaving means and a fourth interleaving means for rearranging order of data input, and a binary circuit 140 which is a binary means for forming data input into a form of a binary. The decoding apparatus 3 takes an analog value due to the influence of noises generated on the memoryless channel 2 and presumes input data D1 in the coding apparatus 1 from a reception word D8 to be a soft-input to output it as decode data D18.

Figure 12:
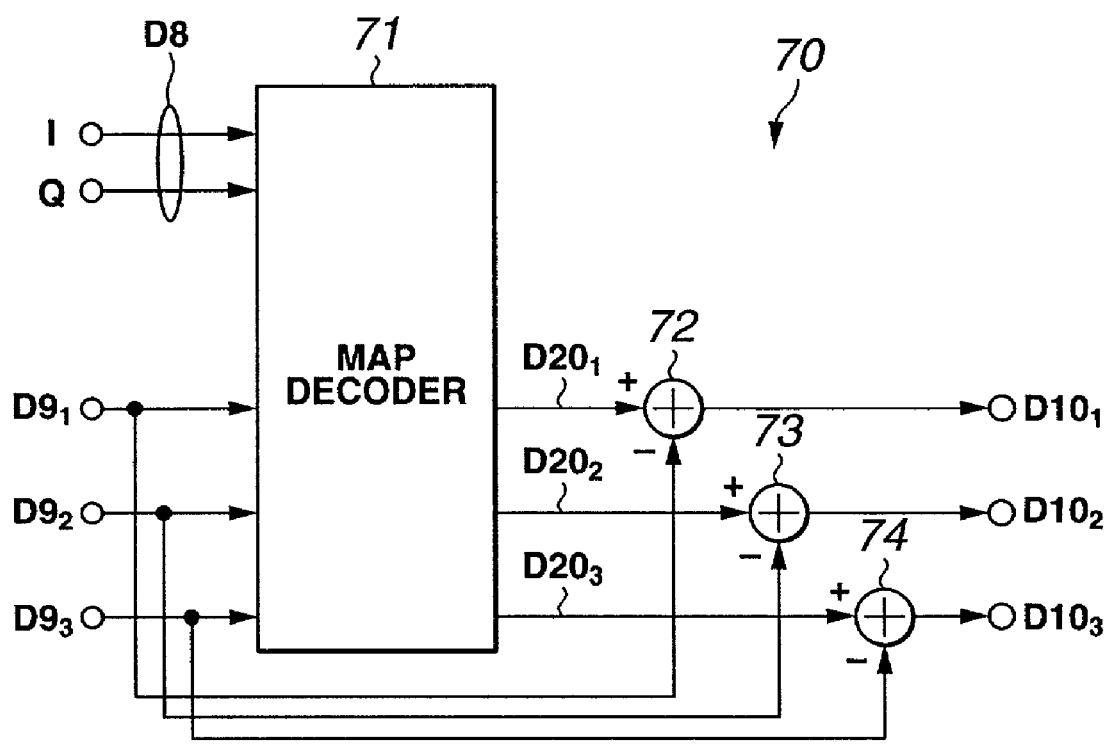
FIG. 12 is a block diagram for explaining the constitution of a soft-output decoding circuit for carrying out soft-output decoding of internal codes provided on a decoding apparatus.

The soft-output decoding circuit 70 is provided corresponding to the convolutional coder 50 in the coding apparatus 1. The soft-output decoding circuit 70 comprises, as shown in FIG. 12, a MAP decoder 71 for carrying out a maximum a posteriori probability, which is hereinafter referred to as MAP, decoding on the basis of a so-called BCJR (Bahl, Cocke, Jelinek and Raviv) algorithm, and three differentiators 72, 73 and 74.

The MAP decoder 71 inputs a reception word D8 which is a soft-output, and priori probability information $D9_1$, $D9_2$ and $D9_3$ with respect to information bit of 3 bits which are a soft-input supplied from the interleaver 90, and carries out MAP decoding based on the BCJR algorithm to produce posteriori probability information $D20_1$, $D20_2$ and $D20_3$ with respect to information bit of 3 bits on the basis of the reception word D8. The MAP decoder 71 supplies the produced posteriori probability information $D20_1$ to the differentiator 72, supplies the produced posteriori probability information $D20_2$ to the differentiator 73, and supplies the produced posteriori probability information $D20_3$ to the differentiator 74.

The differentiator 72 obtains a differential value between the produced posteriori probability information $D20_1$ and the priori probability information $D9_1$, and outputs the differential value to the deinterleaver 80 as a soft-output, as the extrinsic information $D10_1$ of 1 bit out of the extrinsic information D10 with respect to information bit of 3 bits obtained according to the constraint condition of codes.

The differentiator 73 obtains a differential value between the posteriori probability information $D20_2$ to be a soft-output and the priori probability information $D20_2$, and outputs the differential value to the deinterleaver 80 in the later stage as a soft-output, as the extrinsic information $D20_2$ of 1 bit out of the extrinsic information D10 with respect to information bit of 3 bits.

The differentiator 74 obtains a differential value between the posteriori probability information $D20_3$ to be a soft-output and the priori probability information $D20_3$, and outputs the differential value to the deinterleaver 80 in the later stage as a soft-output, as the extrinsic information $D20_3$ of 1 bit out of the extrinsic information D10 with respect to information bit of 3 bits The soft-output decoding circuit 70 as described above inputs the reception word D8 of a soft-input received by the receiving apparatus, inputs the priori probability information D9 with respect to information bit of a soft-input supplied from the interleaver 90, and carries out MAP decoding based on the BCJR algorithm using these reception word D8 and the priori probability information D9 and carries out soft-output decoding of inner codes. The soft-output decoding circuit 70 produces the extrinsic information D10 obtained according to the constraint condition of codes, and outputs extrinsic information D10 to the deinterleaver 80 in the latter stage as a soft-output.

Specifically explaining, let u be the information bit, c the code bit, and y the reception word D8, then the soft-output decoding circuit 70 causes priori probability information D9 (L(u)) expressed in the following Equation (1) to input into the MAP decoder 71 along with the reception word D8 (y):

$$L(u) = \log\frac{P(u = 1)}{P(u = 0)} \tag{1}$$

That is, the soft-output decoding circuit 70 causes the reception word D8 (y) and priori probability information D9 (L(u)) free from the constraint condition of codes expressed by the natural logarithm which is the ratio between the probability P(u—1) whose information bit u is "1" and the probability P(u=0) whose information bit u is "0" to input into the MAP decoder 71.

Continuously, the soft-output decoding circuit 70 carries out MAP decoding on the basis of BCJR algorithm by the MAP decoder 71 to produce posteriori probability information D20 (L*(u)) expressed by the following Equation (2):

$$L^*(u) = \log\frac{P(u = 1|y)}{P(u = 0|y)} \tag{2}$$

That is, the soft-output decoding circuit 70 produces posteriori probability information D20 (L*(u)) on the basis of the constraint condition of codes expressed by the natural logarithm which is the ratio between the probability P (u=1|y) whose information bit u is "1" when received the reception word D8 (y) and the probability P (u=0|y) whose information bit u is "0" when received the reception word D8 (y). The posteriori probability information D20 (L*(u)) is also called the log likelihood ratio, and here, it shows the likelihood of the information bit u when received the reception word D8 (y).

The soft-output decoding circuit 70 obtains extrinsic information D10 (Le(u)) which is a differential value between the posteriori probability information D20 (L*(u)) and the priori probability D9 (L(u)), as expressed by the following Equation (3) by the differentiators 72, 73 and 74.

$$L_e(u) = L^*(u) - L(u) \tag{3}$$

The soft-output decoding circuit 70 produces the extrinsic information D 10 as in the manner as described above, and outputs the extrinsic information D10 to the deinterleaver 80 in the later stage as a soft-output. The extrinsic information D10 corresponds to the interleave data D5 interleaved by the interleaver 40 in the coding apparatus 1.

The deinterleaver 80 applies the interleave to the exterinsic information D10 of a soft-input output from the soft-output decoding circuit 70 so that a bit array of the interleave data D5 interleaved by the interleaver 40 is returned to a bit array of the original code data D4. The deinterleaver 80 outputs the data obtained by being interleaved as priori probability information D11 with respect to the code bit in the soft-output decoding circuit 100 in the latter stage.

The interleaver 90 applies the interleave based on the same exchange position information as the interleaver 40 in the coding apparatus 1 to the exttrinsic information D14 with respect to the code bit which is a soft-output output from the soft-output decoding circuit 100. The interleaver 90 outputs the data obtained by being interleaved as the priori probability information D9 with respect to the signal bit in the soft-output decoding circuit 70.

Figure 13:
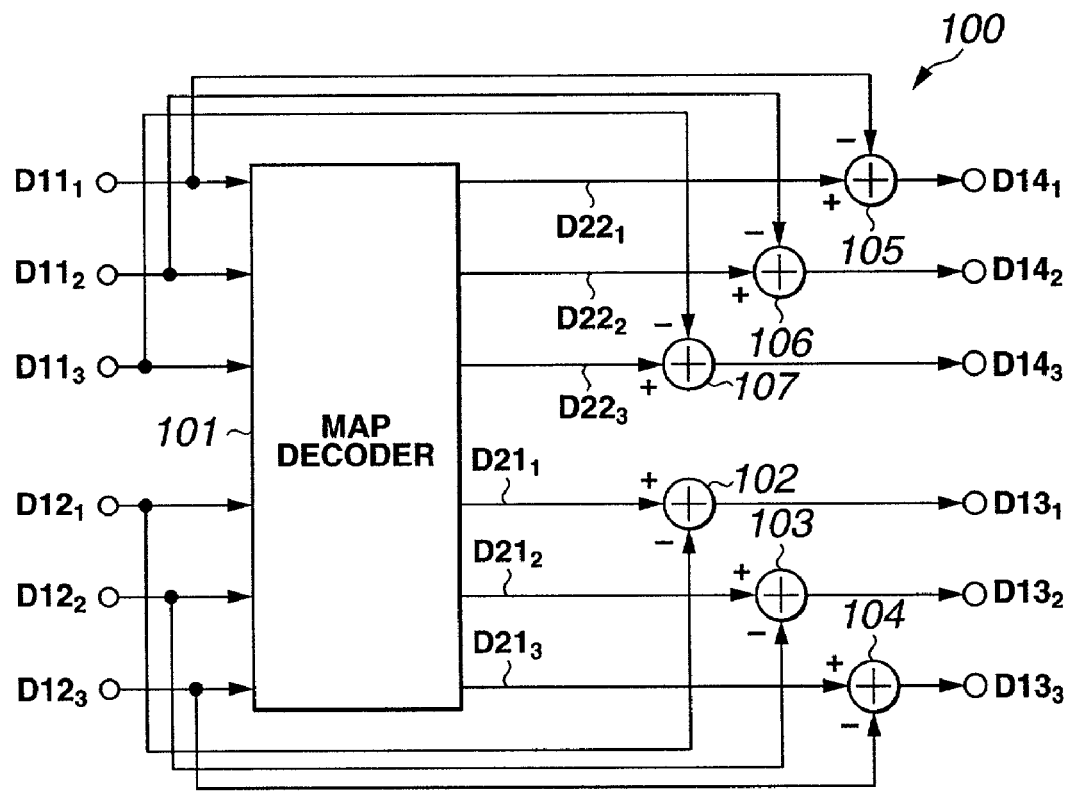
FIG. 13 is a block diagram for explaining the constitution of a soft-output decoding circuit for carrying out soft-output decoding of middle codes provided on a decoding apparatus.

A soft-output decoding circuit 100 is provided corresponding to the convolutional decoder 30 in the coding apparatus 1. The soft-output decoding circuit 100 comprises, as shown in FIG. 13, a MAP decoder 101 for carrying out MAP decoding based on the BCJR algorithm described above, and six differentiators 102, 103, 104, 105, 106 and 107.

A MAP decoder 101 inputs priori probability information D$11_1$, D$11_2$ and D$11_3$ with respect to the code bit of 3 bits which is a soft-output output from the deinterleaver 80, and posterori probability information D$12_1$, D$12_2$ and D$12_3$ with respect to the information bit of 3 bits which is a soft-input supplied from the interleaver 120, and carries out MAP decoding based on the BCJR algorithm to produce posterori probability information D$21_1$, D$21_2$ and D$21_3$ with respect to the information bit of 3 bits and produce posterori probability information D$22_1$, D$22_2$ and D$22_3$ with respect to the information bit of 3 bits. The MAP 101 supplies the produced posterori probability information D$21_1$ to the differentiator 102, supplies the produced posterori probability information D$2_2$ to the differentiator 103, and supplies the produced posterori probability information D$21_3$ to the differentiator 104. Further, The MAP 101 supplies the produced posterori probability information D$22_1$ to the differentiator 105, supplies the produced posterori probability information D$22_2$ to the differentiator 105, and supplies the produced posterori probability information D$22_3$ to the differentiator 106.

The differentiator 102 obtains a differential value between the posterori probability information D$21_1$ to be a soft-input and the priori probability information D$12_1$ to be a soft-input to output the differential value to the deinterleaver 110 in the later stage as a soft-output, as the extrinsic information D$13_1$ of 1 bit out of the extrinsic information D13 with respect to information bit of 3 bits obtained according to the constraint condition of codes.

The differentiator 103 obtains a differential value between the posterori probability information D$21_2$ to be a soft-input and the priori probability information D$12_2$ to be a soft-input to output the differential value to the deinterleaver 110 in the later stage as a soft-output, as the extrinsic information D$13_2$ of 1 bit out of the extrinsic information D13 with respect to information bit of 3 bits.

The differentiator 104 obtains a differential value between the posterori probability information D$21_3$ to be a soft-input and the priori probability information D123 to be a soft-input to output the differential value to the deinterleaver 110 in the later stage as a soft-output, as the extrinsic information D133 of 1 bit out of the extrinsic information D13 with respect to information bit of 3 bits.

The differentiator 105 obtains a differential value between the posterori probability information D$22_1$ to be a soft-input and the priori probability information D$11_1$ to be a soft-input to output the differential value to the interleaver 90 as a soft-output, as the extrinsic information D$14_1$ of 1 bit out of the extrinsic information D14 with respect to information bit of 3 bits.

The differentiator 106 obtains a differential value between the posterori probability information D$22_2$ to be a soft-input and the priori probability information D$11_2$ to be a soft-input to output the differential value to the interleaver 90 as a soft-output, as the extrinic information D$14_2$ of 1 bit out of the exttrinsic information D14 with respect to information bit of 3 bits.

The differentiator 107 obtains a differential value between the posterori probability information D$22_3$ to be a soft-input and the priori probability information D$11_3$ to be a soft-input to output the differential value to the interleaver 90 as a soft-output, as the extrinsic information D$14_3$ of 1 bit out of the extrinsic information D14 with respect to information bit of 3 bits.

The soft-output decoding circuit 100 as described above inputs the priori probability information D11 with respcet to the code bit of a soft-input output from the deinterleaver 80, and inputs the priori probability information D 12 with respect to the information bit of a soft-input supplied from the interleaver 120, and uses these priori probability information D11 and D12 to carry out MAP decoding based on the BCJR algorithm and carry out soft-output decoding of middle codes. The soft-output decoding circuit 100 produces the extrinsic information D13 and D14 obtained according to the constraint condition of codes, and outputs the extrinsic information D13 to the deinterleaver 110 in the later stage as a soft-output, and outputs the extrinsic information D14 to the interleaver 90 as a soft-output.

Specifically explaining, let u be the information bit and c the code bit, then the soft-output decoding circuit 100 causes priori probability information D12 (L(u)) expressed in the following Equation (4) and priori probability information D11 (L(c)) expressed in the following Equation (5) to input into the MAP decoder 101:

$$L(u) = \log\frac{P(u=1)}{P(u=0)} \quad (4)$$

$$L(c) = \log\frac{P(c=1)}{P(c=0)} \quad (5)$$

That is, the soft-output decoding circuit 100 causes the priori probability information D12 (L(u)) on the basis of the constraint condition of codes expressed by the natural logarithm which is the ratio between the probability P(u=1) whose information bit u is "1" and the probability P (u=0) whose information bit u is "0", and the priori probability information D11 (L(c)) on the basis of the constraint condition of codes expressed by the natural logarithm which is the ratio between the probability P(c=1) whose code bit c is "1" and the probability P (c=0) whose code bit c is "0" to input into the MAP decoder 101.

Continuously, the soft-output decoding circuit 100 carries out MAP decoding on the basis of BCJR algorithm by the MAP decoder 101 to produce posteriori probability information D21 (L*(u)) expressed by the following Equation (6) and posteriori probability information D22 (L*(c)) expressed by the following Equation (7):

$$L^*(u) = \log\frac{P(u=1)}{P(u=0)} \quad (6)$$

$$L^*(c) = \log\frac{P(c=1)}{P(c=0)} \quad (7)$$

That is, the soft-output decoding circuit 100 produces posteriori probability information D21 (L*(u)) on the basis of the constraint condition of codes expressed by the natural logarithm which is the ratio between the probability P(u−1) whose information bit u is "1" and the posteriori probability P (u=0) whose information bit u is "0", and posterior probability information D22 (L*(c)) on the basis of the constraint condition of codes expressed by the natural logarithm which is the ratio between the probability P (C=1) whose code bit c is "1" and the probability P(c=0) whose code bit c is "0". It is noted that the constraint conditions of codes described on the right side of the Equations (6) and (7) are omitted here. The posteriori probability information D21 (L*(u)) and the posteriori probability information D22 (L*(c)) are also called the log likelihood ratio, and here, it shows the likelihood of the information bit u and the likelihood of the code bit c.

The soft-output decoding circuit 100 obtains extrinsic information D113 (Le(u)) which is a differential value between the posteriori probability information D21 (L*(u)) and the priori probability D 12 (L(u)), as expressed by the following Equation (8) by the differentiators 102, 103 and 104; and obtains extrinsic information D14 (Le(c)) which is a differential value between the posteriori probability information D22 (L*(c)) and the priori probability D11 (L(c)), as expressed by the following Equation (9) by the differentiators 105, 106 and 107.

$$L_e(u)=L^*(u)-L(u) \quad (8)$$

$$L_e(c)=L^*(c)-L(c) \quad (9)$$

The soft-output decoding circuit 100 produces the extrinsic information D13 and D14 in the manner as described above, outputs the extrinsic information D13 to the deinterleaver 110 in the later stage as a soft-output and outputs the extrinsic information D14 to the deinterleaver 90 as a soft-output. The extrinsic information D13 corresponds to the interleave data D3 interleaved by the interleaver 20.

The deinterleaver 110 applies the deinterleave to the extrinsic information D13 of a soft-input output from the soft-output decoding circuit 100 so that a bit array of the interleave data D3 interleaved by the interleaver 20 is returned to a bit array of the original code data D2. The deinterleaver 100 outputs the data obtained by being interleaved as priori probability information D115 with respect to the code bit in the soft-output decoding circuit 130 in the latter stage.

The interleaver 120 applies the interleave based on the same exchange position information as the interleaver 20 in the coding apparatus 1 to the extrinsic information D18 with respect to the code bit which is a soft-output output from the soft-output decoding circuit 130. The interleaver 120 outputs the data obtained by being interleaved as the priori probability information D12 with respect to the information bit in the soft-output decoding circuit 100.

Figure 14:
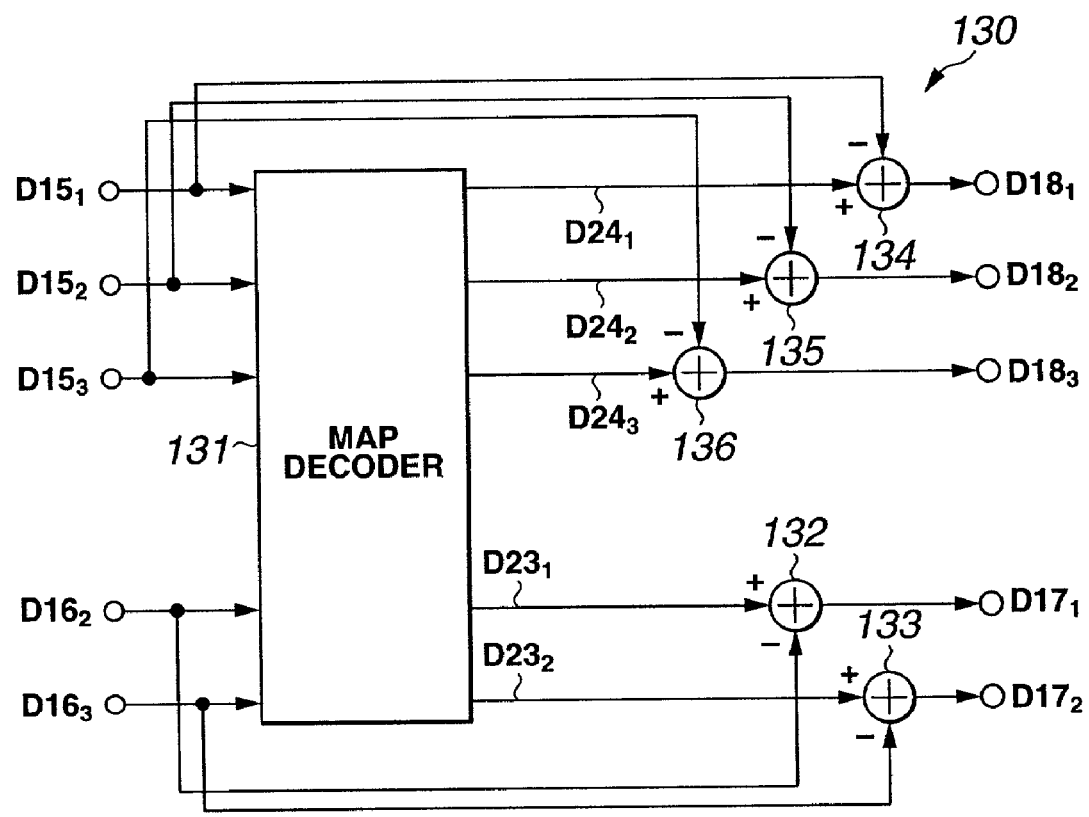
FIG. 14 is a block diagram for explaining the constitution of a soft-output decoding circuit for carrying out soft-output decoding of exterinsic codes provided on a decoding apparatus.

A soft-output decoding circuit 130 is provided corresponding to the convolutional decoder 10 in the coding apparatus 1. The soft-output decoding circuit 130 comprises, as shown in FIG. 14, a MAP decoder 131 for carrying out MAP decoding based on the BCJR algorithm described above, and five differentiators 132, 133, 134, 135, and 136.

A MAP decoder 131 inputs priori probability information D15$_1$, D15$_2$ and D15$_3$ with respect to the code bit of 3 bits which is a soft-output output from the deinterleaver 110, and posteriori probability information D16$_1$ and D16$_2$ with respect to the information bit of 2 bits whose value is "0", and carries out MAP decoding based on the BCJR algorithm to produce posteriori probability information D21$_1$, D21$_2$ and D21$_3$ with respect to the information bit of 3 bits and produce posteriori probability information D23$_1$ and D23$_2$ with respect to the information bit of 3 bits and produce posteriori probability information D24$_1$, D24$_2$ and D24$_3$ with respect to the code bit of 3 bits. The MAP 131 supplies the produced posteriori probability information D23$_1$ to the differentiator 132, and supplies the produced posteriori probability information D23$_2$ to the differentiator 133. Further, the MAP 131 supplies the produced posteriori probability information D24$_1$ to the differentiator 134, supplies the produced posteriori probability information D24$_2$ to the differentiator 135, and supplies the produced posteriori probability information D24$_3$ to the differentiator 136.

The differentiator 132 outputs a differential value between the posteriori probability information D23$_1$ to be a soft-input and the priori probability information D16$_1$ whose value is "0", that is, the priori probability information D23$_1$ to the binary circuit 140 as a soft-output, as the extrinsic information D17, of 1 bit out of the extrinsic information D17 with respect to information bit of 2 bits obtained according to the constraint condition of codes.

The differentiator 133 outputs a differential value between the posteriori probability information D23$_2$ to be a soft-input and the priori probability information D16$_2$ whose value is "0", that is, the posteriori probability information D23$_2$ to the binary circuit 140 in the later stage as a soft-output, as the extrinsic information D 17$_2$ of 1 bit out of the extrinsic information D17 with respect to information bit of 2 bits.

The differentiator 134 obtains a differential value between the posteriori probability information D24$_1$ to be a soft-input and the priori probability information D15$_1$ to be a soft-input to output the differential value to the interleaver 120 as a soft-output, as the extrinsic information D18$_1$ of 1 bit out of the extrinsic information D18 with respect to code bit of 3 bits.

The differentiator 135 obtains a differential value between the posteriori probability information D24$_2$ to be a soft-input and the priori probability information D15$_2$ to be a soft-input to output the differential value to the interleaver 120 as a soft-output, as the extrinsic information D18$_2$ of 1 bit out of the extrinsic information D18 with respect to the code bit of 3 bits.

The differentiator 136 obtains a differential value between the posteriori probability information D24$_3$ to be a soft-input and the priori probability information D15$_3$ to be a soft-input to output the differential value to the interleaver 120 as the extrinsic information D18$_3$ of 1 bit out of the extrinsic information D18 with respect to the information bit of 3 bits.

The soft-output decoding circuit 130 as described above inputs the priori probability information D15 with respect to the code bit of a soft-input output from the deinterleaver 110, and inputs the priori probability information D16 with respect to the information bit whose value is "1", and uses these priori probability information D15 and D16 to carry out MAP decoding based on the BCJR algorithm and carry out soft-output decoding of outer codes. The soft-output decoding circuit 130 produces the extrinsic information D17 and D18 obtained according to the constraint condition of codes, and outputs the extrinsic information D17 to the binary circuit 140 in the later stage as a soft-output, and outputs the extrinsic information D18 to the interleaver 120 as a soft-output.

Specifically explaining, let u be the information bit and c the code bit, as described above, then the soft-output decoding circuit 130 causes priori probability information D16 (L(u)) expressed in the above Equation (4) and priori probability information D15 (L(c)) expressed in the above Equation (5) to input into the MAP decoder 131. It is noted here that priori probability information D16 (L(u)) is "0" because the probability whether the information bit u is "0" or "1" is ½.

Continuously, the soft-output decoding circuit 130 carries out MAP decoding on the basis of BCJR algorithm by the MAP decoder 131 to produce posteriori probability information D23 (L*(u)) expressed by the above Equation (6) and posteriori probability information D22 (L*(c)) expressed by the above Equation (7). That is, the soft-output decoding circuit 130 produces the posteriori probability information D23 (L*(u)) on the basis of the constraint condition of codes expressed by the natural logarithm of the ratio between the probability P (u=1) whose information bit u is "1" and the probability P (u=0) whose information bit u is "0" and the posteriori probability information D24 (L*(c)) on the basis of the constraint condition of codes expressed by the natural logarithm of the ratio between the probability P (c=1) whose code bit c is "1" and the probability P (c=0) whose code bit c is "0". It is noted that these posteriori probability information D23 (L*(u)) and posteriori probability information D24 (L*(c)) are also called the log likelihood ratio, and here, it shows the likelihood of the information bit u and the likelihood of the code bit c.

The soft-output decoding circuit 130 obtains extrinsic information D17 (Le(u)) which is a differential value between the posteriori probability information D23 (L*(u)) and the priori probability D16 (L(u)), as expressed by the above Equation (8) by the differentiators 132 and 133; and obtains extrinsic information D18 (Le(c)) which is a differential value between the posteriori probability information D24 (L*(c)) and the priori probability D15 (L(c)), as expressed by the above Equation (9) by the differentiators 134, 135, and 136.

The soft-output decoding circuit 130 produces the extrinsic information D17 and D18 in the manner as described above, outputs the extrinsic information D17 to the binary circuit 140 in the later stage as a soft-output and outputs the extrinsic1 information D18 to the deinterleaver 120 as a soft-output.

The soft-output decoding circuit 130 need not always be provided with the differentiators 132 and 133 since the priori probability information D16 with respect to the information bit is "0".

The binary circuit 140 forms extrinsic information D17 of soft-output produced by the soft-output decoding circuit 130, that is, extrinsic information D17 supplied from the soft-output decoding circuit 130 in a form of binary on the basis of the posteriori probability information D23 to output it as decode data D18 of hard-output.

The decoding apparatus 3 as described above is provided with soft-output decoding circuits 70, 100 and 130 corresponding to the convolutional coders 50, 30 and 10, respectively, in the coding apparatus 1 whereby codes of high decoding complicatedness can be decomposed into elements of small complicatedness, and the characteristics can be successively enhanced by mutual action between the soft-output decoding circuits 70, 100 and 130. The decoding apparatus 3, when inputting the reception word D8, carries out decoding operation of the soft-output decoding circuits 70 to 130 iteratively by the predetermined number of times, for example, such as several times and scores of times, and outputs decode data D19 on the basis of the extrinsic information D17 of soft-output obtained as a result of the predetermined number of times of the decoding operation, that is, on the basis of the posteriori probability information D23.

As explained above, in the data transmit-receive system constituted using the coding apparatus 1 and the decoding apparatus 3, the decoding apparatus 3 has the convolutional coders 10, 30 and 50 serially concatenated to carry out convolutional operation whose code rate is expressed by "k/(k+1)" (k is arbitrary natural number more than 2) as coding of outer codes, after which carries out convolutional operation whose code rate is "1" as coding of middle codes and inner codes, whereby the whole code rate can be maintained at a high value, "k/(k+1)". Further, the coding apparatus 1 carries out the convolutional operation iteratively to carry out coding of high performance under the high code rate. In the decoding apparatus 3, are provided to be concatenated with the soft-output decoding circuits 70, 100, and 130 each corresponding to the convolutional coders 50, 30 and 10 in the coding apparatus 1 whereby decoding of high precision can be carried out. That is, the data transmit-receive system constituted using these coding apparatus 1 and decoding apparatus 3 is to realize coding and decoding according to the SCTCM system with high performance to enable provision of high reliance for a user.

The present invention is not limited to the above-described embodiments. For example, the convolutional coder for carrying out coding of middle codes in the coding apparatus need not be a single but two or more of them may be used. It is of course that as the whole coding apparatus, four or more convolutional coders may be provided. Needless to say, in this case, an interleaver is provided between a plurality of convolutional coders for carrying out coding of middle codes.

Further, as the coding apparatus, those other than that carries out coding by the convolutional operation will suffice, and the present invention can be applied even if the convolutional coders shown in the above-described embodiments are replaced by coders other than the convolutional operation.

While in the aforementioned embodiments, a description has been made of a case in which coding whose code rate is "⅔" is carried out as coding of outer codes, and coding whose code rate is "1" is carried out as coding of middle codes and inner codes, it is noted that the present invention is not adherred thereto but the present invention may be also applied to the case in which coding is carried out at least once whose code rate is "1" or more, for example, such that code rate of outer codes is "²⁄₄=½", code rate of middle codes is "⁴⁄₃", and code rate of inner codes is "1", and the code rate is "k/(k+1) (=⅔)" as a whole.

Further, while in the above-described embodiments, a description has been made applying the 8PSK modulation system as multi-value modulation, it is to be noted that the present invention can be also applied to other multi-value modulation systems such that, for example, the code rate in the coding apparatus is "¾" as a whole, and mapping is made to a transmission symbol of a 16 QAM (16-quadrature amplitude modulation) modulation system.

Further, while in the above-described embodiments, a description has been made of a soft-output decoding circuit in the decoding apparatus in which MAP decoding based on the BCJR logarithm is carried out, it is to be noted that the present invention can be also applied to other soft-output decodings, for example, such that decoding according to a so-called SOVA (Soft Output Viterbi Logarithm).

Further, while in the above-described embodiments, a description has been made of a case where the coding apparatus and the decoding apparatus are applied to the transmission apparatus and the receiving apparatus in the data transmit-receive system, the present invention can be also applied, for example, to a recording and or a reproducing apparatus for carrying out recording and or reproducing with respect to recording media such as a magnetic, optical or optical magnetic disk or the like such as a floppy disk, CD-ROM or MO (Magneto Optical). In this case, data coded by the coding apparatus are recorded in a recording medium equivalent to a memoryless channel, and decode and reproduced by the decoding apparatus.

Furthermore, while in the above-described embodiments, a description has been made of a case in which both coding apparatus and decoding apparatus comprise an apparatus constituted of hardware, it is to be noted that both the coding apparatus and decoding apparatus can be realized as softwares capable of being executed in a computer apparatus, for example, such as a work station or a personal computer. This embodiment will be described hereinafter with reference to FIG. 15.

Figure 15:
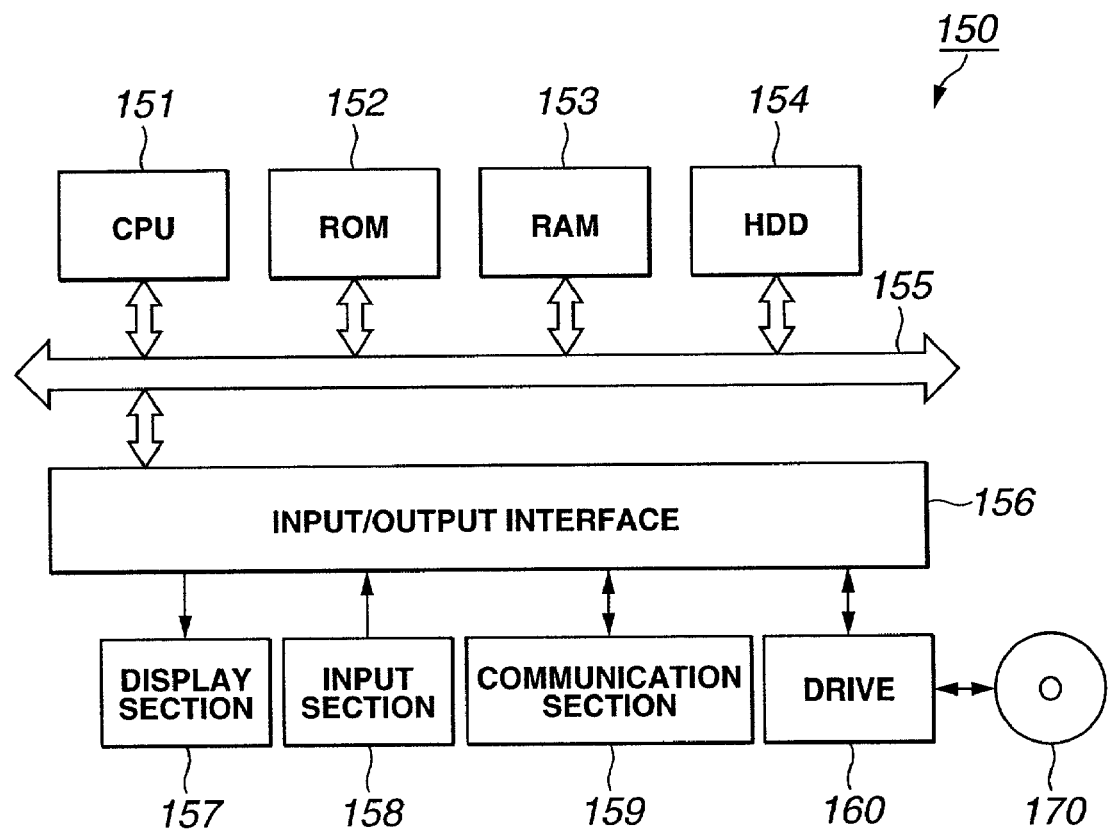
FIG. 15 is a block diagram for explaining the constitution of a computer apparatus.

A computer apparatus 150 comprises, as shown in FIG. 15, a CPU (Central Processing Unit) 151 for collectively controlling various parts, a ROM 152 exclusive use for reading for storing information including various programs, a RAM (Random Access Memory) 153 which functions as a work area, a HDD (Hard Disk Drive) 154 for carrying out recording and/or reproducing of various programs, data and so on, a bus 155 for connecting these CPU 151, ROM 152, RAM 153, and HDD 154, an input/output interface 156 for carrying out inputting and outputting between the CPU 151, ROM 152, RAM 153, and HDD 154, and a display section 157, an input section 153, a communication section 159, and a drive 160 which will be described later, a display section 157 for displaying various information, an input section 158 for receiving user's operation, a communication section 159 for carrying out communication with the outside, and a drive 160 for carrying out recording and or reproducing of various information with respect to a detachable recording medium 170.

The CPU 151 is connected through the bus 155 to ROM 152, RAM 153, and HDD 154 to control these ROM 152, RAM 153, and HDD 154. The CPU 151 is further connected through the bus 155 to the input/output interface 156 to control the display section 257, the input section 158, the communication section 159, and the drive 160 connected to the input/output interface 156. The CPU 151 further executes various programs recorded in the recording medium 170 mounted on the ROM 151, ROM152, HDD154 or the drive 160.

The ROM 152 stores information including various programs therein. Information stored in the ROM152 is read under the control of CPU 151.

The RAM 153 functions as a work area when CPU 151 executes various programs to temporarily store various data under the control of CPU 151.

The HDD 154 carries out recording and or reproducing of various programs, data and so on with respect to the hard disk under the control of CPU 151.

The bus 155 transmits various data read out of ROM 152, RAM 153, and HDD 154 under the control of CPU 151, and transmits various data to be recorded in RAM 153, and HDD 154.

The input/output interface 156 has an interface for displaying various information in the display section 157 under the control of CPU 151, an interface for transmitting a control signal indicative of contents operated through the input section 158 by a user to CPU 151, an interface for inputting and outputting data with respect to the outside through the communication section 159 under the control of CPU 151, and an interface for carrying out recording and or reproducing of various information with respect to the recording medium 170 mounted on the drive 160 to output data from CPU 151, ROM 152, RAM 153, and HDD 154 to the display section 157, the input section 158, the communication section 159 and the drive 160, or inputs data from the display section 157, the input section 158, the communication section 159 and the drive 160 into CPU 151, ROM 152, RAM 153, and HDD 154.

The display section 157 comprises, for example, LCD (Liquid Crystal Display), to display various information such as data recorded, for example, in the HDD 154 under the control of CPU 151.

The input section 158 receives, for example, operation of a keyboard or a mouse by a user to output a control signal indicative of contents of operation to CPU 151.

The communication section 150 functions as an interface for carrying out, for example, communication with the outside by a network circuit, a satellite circuit or the like under the control of CPU 151.

The drive 160 mounts or dismounts the recording medium 170 such as a magnetic, light or photo electromagnetic disk, for example, such as a floppy disk, CD-ROM or MO, and carries out recording and or reproducing of various information with respect to the recording medium 170 mounted under the control of CPU 151.

The computer apparatus 150 realizes coding process in the above-described coding apparatus and or decoding process in the decoding apparatus 3 by CPU 151 which executes programs.

First, the coding process in the computer apparatus 150 will be described. The computer apparatus 150, when for example, a user carries out predetermined operation for executing a code program, supplies a control signal indicative of contents of operation to CPU 150 by th input section 158. In response thereto, the computer apparatus 150 loads a code program to RAM 153 to execute it, and outputs a code transmission symbol obtained by coding to the outside through the communication section 159, and displays the processed results or the like on the display section 157 as necessary.

As used herein, the code program is provided, for example, by the recording medium 170, and may be read directly from the recording medium 170 under the control of CPU 151, or one recorded in the hard disk once may be read. The code program may be stored in advance in ROM 152. Further, data subjected to coding is recorded in the hard disk here. This data corresponds to the aforementioned input data D1.

Concretely, the computer apparatus 150, when a code program is executed by CPU150, reads the desired data stored in the hard disk under the control of CPU 151, and carries out convolutional operation whose code rate is "$2/3$" as coding of outer codes with respect to the data to produce code data corresponding to the aforementioned code data D2.

Continuously, the computer apparatus 150 applies interleave to the produced code data under the control of CPU 151 to produce interleave data corresponding to the aforementioned inerleave data D3.

Continuously, the computer apparatus 150 carries out convolutional operation whose code rate is "$3/3=1$" as coding of middle codes with respect to the produced interleave data under the control of CPU 151 to produce code data corresponding to the aforementioned code data D4.

Continuously, the computer apparatus 150 applies interleave to the produced code data under the control of CPU 151 to produce interleave data corresponding to the aforementioned inerleave data D5.

Continuously, the computer apparatus 150 carries out convolutional operation whose code rate is "3/3=1" as coding of inner codes with respect to the produced interleave data under the control of CPU 151 to produce code data corresponding to the aforementioned code data D6.

Then, the computer apparatus 150 applies mapping to a transmission symbol of a 8PSK with respect to the produced code data under the control of CPU 151 to produce code transmission symbol corresponding to the aforementioned code data D7.

The computer apparatus 150 records the produced code transmission symbol in the hard disk or the like once, under the control of CPU 151, after which reads the code transmission symbol at the desired timing to output it outside through the communication section 159, and display the result of process on the display section 157 as necessary. It is noted that the produced code transmission symbol can be also recorded on the recording medium 170 or the like.

As described above, the computer apparatus 150 is able to realize the code process in the aforementioned coding apparatus 1 by executing the code program.

Next, decoding process in the computer apparatus 150 will be described. In the computer apparatus 150, for example, when a user carries out predetermined operation for executing a decode program, a control signal indicative of contents of operation is supplied to CPU 151 by the input section 158. In response theereto, the computer apparatus 150 loads a decode program to RAM 153 to execute it by CPU 151, receives the program from the outside through the communication section 159 to decode a reception word corresponding to the aforementioned reception word D8 and being recorded in the hard disk or the like and display the result of process or the like on the display section 157 as necessary.

The decoded program is also provided, for example, by the recording medium 170, similar to the code program, and may be read directly from the recording medium 170 under the control of CPU 151, or one recorded in the hard disk once may be read. The code program may be stored in advance in ROM 152.

Concretely, the computer apparatus 150, when a code program is executed by CPU150, carries out MAP decoding, for example, based on the BCJR logarithm with respect to a reception word read out of the hard disk, or a reception word received through the communication section 159, under the control of CPU 151, to thereby carry out soft-output decoding of inner codes to produce extrinsic information corresponding to the aforementioned extrinsic information D10.

Continuously, the computer apparatus 150 applies a deinterleave to the produced extrinsic information under the control of CPU 151 to produce priori probability information corresponding to the aforementioned extrinsic information D11.

Continuously, the computer apparatus 150 carries out MAP decoding based, for example, on the BCJR logarithm with respect to the produced priori probability information under the control of CPU 151 to thereby carry out soft-output decoding of middle codes to produce extrinsic information corresponding to the aforementioned extrinsic information D13 and D14.

Continuously, the computer apparatus 150 applies deinterleave to extrinsic information corresponding to the aforementioned extrinsic information D13 under the control of CPU151 to produce priori probability information corresponding to the aforementioned priori probability information D15, and applies interleave to extrinsic information corresponding to the aforementioned extrinsic information D14 to produce priori probability information corresponding to the aforementioned priori probability information D9.

Continuously, the computer apparatus 150 carries out, for example, MAP decoding based on the BCJR logarithm with respect to priori probability information corresponding to the aforementioned priori probability information D15 to thereby carry out soft-output decoding of outer codes to produce extrinsic information corresponding to the aforementioned extrinsic information D18, and applies interleve to the extrinsic information to produce priori probability information corresponding to the aforementioned priori probability information D12.

Then, the computer apparatus 150 carries out such a decoding operation as described above iteratively by the predetermined number of times, for example, such as several times or scores of times, and outputs decoding data of hard-output on the basis of extrinsic information of soft-output obtained as a result of the predetermined number of times of decoding operation corresponding to the aforementioned extrinsic information D17.

The computer apparatus 150 records the obtained decode data in the hard disk or the like under the control of CPU 151, and displays the result of process or the like on the display section 157. The obtained decode data can be also recorded in the recording medium 170 or the like.

As described above, the computer apparatus 150 is able to realize the decoding process in the aforementioned decoding apparatus 3 by executing the decode program.

It is noted of course that the present invention can be changed suitably within the scope not departing from the gist thereof.

As described above in detail, coding apparatus according to the present invention, a first coding means carries out coding whose code rate is k/(k+1) with respect to data of k-bit input; a first interleaving means interleaves order of bits constituting data comprising a bit series of (k+1) bits coded by the first coding means; at least one or more second coding means and second interleaving means carry out coding whose code rate is 1 with respect to data of (k+1) bit input and interleave order of bits constituting data comprising a bit series of (k+1) bits code; a third coding means carries out coding whose code rate is 1 with respect to data of (k+1) bit input; and a mapping means maps data of (k+1) bit coded by the third coding means to a transmission symbol of a predetermined modulation.

Further, in the coding method or coded program thereof according to the present invention, a first coding step carries out coding whose code rate is k/(k+1) with respect to data of k-bit input; a first interleaving step interleaves and rearranges order of bits constituting data comprising a bit series of (k+1) bits coded by the first coding step; a coding processing step carries out at least one or more processes including a second coding step for carrying out coding whose code rate is 1 with respect to data of (k+1) bit input; and a second interleaving step interleaves order of bits constituting data comprising a bit series of (k+1) bits coded by the second coding step; a third coding step carries out coding whose code rate is 1 with respect to data of (k+1) bit processed by the coding processing step; a mapping step maps data of (k+1) bit code by the third coding step to a transmission symbol of a predetermined modulation.

Furthermore, in the decoding apparatus according to the present invention, a first soft-output decoding means carries out soft-output decoding using a reception word which is a soft-input input, and priori probability information with respect to information bits of (k+1) bits which is a soft-input input; at least one or more first deinterleaving means, second soft-output decoding means and third deinterleaving means rearranges data of(k+1) bit of a soft-input input, carry out soft-output decoding using priori probability information with respect to code bits of (k+1) bits which are a soft-input output from the first deinterleaving means, and priori probability information with respect to information bits of(k+1) bits which are a soft-input input, and interleave order of bits constituting data comprising a bit series of (k+1) pieces of a soft-input output from the respective ones of the at least one or more second soft-output decoding means on the basis of the same exchange position information as that of the second interleaving means; a second deinterleaving means rearranges data of (k+1) bits of a soft-input input; a third soft-output decoding means carries out soft-output decoding using priori probability information with respect to code bits of (k+1) bits which are a soft-input output from the second deinterleaving means, and priori probability information with respect to information bits of (k+1) bits which are a soft-input input; and a fourth interleaving means interleaves order of bits constituting data comprising a bit series of (k+1) pieces of a soft-input output from the third soft-output decoding means on the basis of the same exchange position information as that of the first interleaving means.

Further, in the decoding method or coded program thereof according to the present invention as described above, a first soft-output decoding step carries out soft-output decoding using a reception word which is a soft-input input, and priori probability information with respect to information bits of (k+1) bits which is a soft-input input; a second deinterleaving step rearranges data of (k+1) bits of a soft-input processed by the decoding processing step; a third soft-output decoding step carries out soft-output decoding using priori probability information with respect to code bits of (k+1) bits which are a soft-input output rearranged by the second deinterleaving step, and priori probability information with respect to information bits of (k+1) bits which are a soft-input input; and a fourth interleaving step interleaves order of bits constituting data comprising a bit series of (k+1) pieces of a soft-input output from the third soft-output decoding step on the basis of the same exchange position information as that of the first interleaving step.

What is claimed is:

1. A decoding apparatus for carrying out decoding of codes subjected to serially concatenated code modulation by coding equipment comprising: a first coding means for carrying out coding whose code rate is k/(k+1) with respect to data of k-bit input; a first interleaving means for interleaving order of bits constituting data comprising a bit series of (k+1) bits coded by said first coding means; at least one or more second coding means serially concatenated with the later stage away from said first interleaving means to carry out coding whose code rate is 1 with respect to data of (k+1) bit input; at least one or more second interleaving means serially concatenated with said at least one or more second coding means to interleave order of bits constituting data comprising a bit series of (k+1) bits coded by said second coding means in the first stage: a third coding means serially concatenated with the second interleaving means in the final stage to carry out coding whose code rate is 1 with respect to data of (k+1) bit input; and a mapping means for mapping data of (k+1) bit coded by said third coding means to a transmission symbol of a predetermined modulation, said decoding apparatus comprising:

a first soft-output decoding means provided corresponding to said third coding means to carry out soft-output decoding using a reception word which is a soft-input input, and priori probability information with respect to information bits of (k+1) bits which is a soft-input input;

at least one or more first deinterleaving means serially concatenated with the later stage away from said first soft-output decoding means to rearrange data of (k+1) bits of a soft-input input so that a bit array of data of (k+1) bits rearranged by said second interleaving means is returned to a bit array of data of (k+1) bits coded by said second coding means;

at least one or more second soft-output decoding means provided corresponding to the said at least one or more second coding means and serially concatenated with said at least one or more first deinterleaving means to carry out soft-output decoding using priori probability information with respect to code bits of (k+1) bits which are a soft-input output from said first deinterleaving means, and priori probability information with respect to information bits of (k+1) bits which are a soft-input input;

one or more third interleaving means for interleaving order of bits constituting data comprising a bit series of (k+1) pieces of a soft-input output from said at least one or more second soft-output decoding means on the basis of the same exchange position information as that of said second interleaving means;

a second deinterleaving means serially concatenated with the second soft-output decoding means in the final stage to rearrange data of (k+1) bits of a soft-input input so that a bit array of data of (k+1) bits rearranged by said first interleaving means is returned to a bit array of data of (k+1) bits coded by said first coding means;

a third soft-output decoding means provided corresponding to said first coding means and serially concatenated with said second deinterleaving means to carry out soft-output decoding using priori probability information with respect to code bits of (k+1) bits which are a soft-input output from said second deinterleaving means, and priori probability information with respect to information bits of (k+1) bits which are a soft-input input; and a fourth interleaving means for interleaving order of bits constituting data comprising a bit series of (k+1) pieces of a soft-input output from said third soft-output decoding means on the basis of the same exchange position information as that of said first interleaving means.

2. The decoding apparatus according to claim 1, further comprising a binary means for forming extrinsic information of a soft-output produced by said third soft-output decoding means into a binary form to output it as decode data of k-bit of a hard-output.

3. The decoding apparatus according to claim 1 wherein said first soft-output decoding means, said second soft-output decoding means, and said third soft-output decoding means respectively carry out maximum posteriori probability decoding based on the Bahl, Cocke, Jelinek and Raviv (BCJR) algorithm.

4. The decoding apparatus according to claim 1 wherein said first coding means, said second coding means, and said third coding means respectively carry out convolutional operation with respect to data input.

5. The decoding apparatus according to claim 4 wherein at least said second coding means and said third coding means respectively carry out recursive systematic convolutional operation with respect to data input.

6. The decoding apparatus according to claim 1 wherein said first interleaving means, said second interleaving means, said third interleaving means, and said fourth interleaving means are respectively random interleavers.

7. The decoding apparatus according to claim 1 wherein said mapping means carries out modulation according to a 8-phase shit keying.

8. A decoding method for carrying out decoding of codes subjected to serially concatenated code modulation by a coding method comprising: a first coding step for carrying out coding whose code rate is k/(k+1) with respect to data of k-bit input; a first interleaving step for interleaving order of bits constituting data comprising a bit series of (k+1) pieces coded by said first coding step; a coding processing step for carrying out at least one or more processes including a second coding step for carrying out coding whose code rate is 1 with respect to data of (k+1) bit input and a second interleaving step for interleaving order of bits constituting data comprising a bit series of (k+1) pieces coded by said second coding step; a third coding step for carrying out coding whose code rate is 1 with respect to data of (k+1) bit processed by said coding processing step and input; and a mapping step for mapping data of (k+1) bits coded by said third coding step to a transmission symbol of predetermined modulation system;

said decoding method comprising:

first soft-output decoding, corresponding to said third coding step, using a reception word which is a soft-input input, and priori probability information with respect to information bits of (k+1) bits which is a soft-input input;

carrying out at least one or more processes including a first deinterleaving step, a second soft-output decoding step and a third interleaving step with respect to data of (k+1) bits of a soft-input input;

a second deinterleaving step for rearranging data of (k+1) bits of a soft-input input processed by said carrying out step input so that a bit array of data of (k+1) bits rearranged by said first interleaving step is returned to a bit array of data of (k+1) bits coded by said first coding step;

third soft-output decoding, corresponding to said first coding step, using priori probability information with respect to code bits of (k+1) bits which are a soft-input output rearranged by said second deinterleaving step, and priori probability information with respect to information bits of (k+1) bits which are a soft-input input; and fourth interleaving order of bits constituting data comprising a bit series of (k+1) pieces of a soft-input output produced by said third soft-output decoding step on the basis of the same exchange position information as that of said first interleaving step;

said first deinterleaving step rearrange data of (k+1) bits of a soft-input input so that a bit array of data of (k+1) bits rearranged by said second interleaving step is returned to a bit array of data of (k+1) bits coded by said second coding step;

said second soft-output decoding step being provided corresponding to of said at least one or more second coding steps to carry out soft-output decoding using priori probability information with respect to code bits of (k+1) bits which are a soft-input output rearranged by said first deinterleaving step, and priori probability information with respect to information bits of (k+1) bits which are a soft-input input; and said third interleaving step interleaving order of bits constituting data comprising a bit series of (k+1) pieces of a soft-input output produced by of said at least one or more second soft-output decoding steps on the basis of the same exchange position information as that of said second interleaving step.

9. The decoding method according to claim 8, further comprising forming extrinsic information of a soft-output produced by said third soft-output decoding step into a binary form to output it as decode data of k-bit of a hard-output.

10. The decoding method according to claim 8 wherein said first soft-output decoding step, said second soft-output decoding step, and said third soft-output decoding step respectively carry out maximum posteriori probability decoding based on the Bahl, Cocke, Jelinek and Raviv (BCJR) algorithm.

11. The decoding method according to claim 8 wherein said first coding step, said second coding step, and said third coding step respectively carry out convolutional operation with respect to data input.

12. The decoding method according to claim 11 wherein at least said second coding step and said third coding step respectively carry out recursive systematic convolutional operation with respect to data input.

13. The decoding method according to claim 8 wherein said first interleaving step, said second interleaving step, said third interleaving step, and said fourth interleaving step respectively carry out random interleave.

14. The decoding method according to claim 8 wherein said mapping step carries out modulation according to a 8-phase shift keying.

15. A recording medium having recorded a decoded program capable of being controlled by a computer to perform a decoding method for carrying out decoding of codes subjected to serially concatenated code modulation by a coding method comprising: a first coding step for carrying out coding whose code rate is k/(k+1) with respect to data of k-bit input; a first interleaving step for interleaving order of bits constituting data comprising a bit series of (k+1) pieces coded by said first coding step; a coding processing step for carrying out at least one or more processes including a second coding step for carrying out coding whose code rate is 1 with respect to data of (k+1) bit input and a second interleaving step for interleaving order of bits constituting data comprising a bit series of (k+1) pieces coded by said second coding step; a third coding step for carrying out coding whose code rate is 1 with respect to data of (k+1) bit processed by said coding processing step and input; and a mapping step for mapping data of (k+1) bits coded by said third coding step to a transmission symbol of predetermined modulation system;

said decoding method comprising:

first soft-output decoding, corresponding to said third coding step, using a reception word which is a soft-input input, and priori probability information with respect to information bits of (k+1) bits which is a soft-input input;

carrying out at least one or more processes including a first deinterleaving step, a second soft-output decoding step and a third interleaving step with respect to data of (k+1) bits of a soft-input input;

a second deinterleaving step for rearranging data of (k+1) bits of a soft-input processed by said carrying out step input so that a bit array of data of (k+1) bits rearranged by said first interleaving step is returned to a bit array of data of (k+1) bits coded by said first coding step;

third soft-output decoding, corresponding to said first coding step, using priori probability information with respect to code bits of (k+1) bits which are a soft-input rearranged by said second deinterleaving step, and priori probability information with respect to information bits of(k+1) bits which are a soft-input input; and fourth interleaving order of bits constituting data comprising a bit series of (k+1) pieces of a soft-input output produced by said third soft-output decoding step on the basis of the same exchange position information as that of said first interleaving step;

said first deinterleaving step rearrange data of (k+1) bits of a soft-input input so that a bit array of data of (k+1) bits rearranged by said second interleaving step is returned to a bit array of data of (k+1) bits coded by said second coding step;

said second soft-output decoding step being provided corresponding to of said at least one or more second coding steps to carry out soft-output decoding using priori probability information with respect to code bits of (k+1) bits which are a soft-input output rearranged by said first deinterleaving step, and priori probability information with respect to information bits of (k+1) bits which are a soft-input input; and said third interleaving step interleaving order of bits constituting data comprising a bit series of (k+1) pieces of a soft-input produced by of said at least one or more second soft-output decoding steps on the basis of the same exchange position information as that of said second interleaving step.

16. The recording medium having a decode program recorded according to claim 15 wherein said decode program comprises a binary step for forming extrinsic information of a soft-output produced by said third soft-output decoding step into a binary form to output it as decode data of k-bit of a hard-output.

* * * * *